(12) United States Patent
Kim et al.

(10) Patent No.: US 10,522,431 B2
(45) Date of Patent: Dec. 31, 2019

(54) DISPLAY DEVICE

(71) Applicant: Samsung Display Co., Ltd., Yongin-si (KR)

(72) Inventors: Hyun Woong Kim, Gwangmyeong-si (KR); Won Kyu Kwak, Seongnam-si (KR); Seung-Kyu Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/616,871

(22) Filed: Jun. 7, 2017

(65) Prior Publication Data

US 2018/0158741 A1 Jun. 7, 2018

(30) Foreign Application Priority Data

Dec. 5, 2016 (KR) ........................ 10-2016-0164328

(51) Int. Cl.
*H01L 27/12* (2006.01)
*H01L 27/32* (2006.01)
(Continued)

(52) U.S. Cl.
CPC ............. *H01L 22/32* (2013.01); *G09G 3/006* (2013.01); *H01L 22/12* (2013.01); *H01L 22/34* (2013.01);
(Continued)

(58) Field of Classification Search
CPC ......... H01L 22/32; H01L 22/12; H01L 22/34; H01L 27/1214–27/1296; H01L 27/124;
(Continued)

(56) References Cited

U.S. PATENT DOCUMENTS 9,182,866 B2 11/2015 Inagaki et al.
9,448,757 B2 9/2016 Kim et al.
(Continued)

FOREIGN PATENT DOCUMENTS

EP 2 983 157 2/2016
EP 3 098 869 11/2016
(Continued)

OTHER PUBLICATIONS

Extended European Search Report dated May 11, 2018, in European Patent Application No. 17193356.7.
(Continued)

*Primary Examiner* — Natalia A Gondarenko
(74) *Attorney, Agent, or Firm* — H.C. Park & Associates, PLC

(57) ABSTRACT

A display device includes a display area, a peripheral area, a pad portion, a bending area, a first crack detection circuit, and a first crack detection line. The display area includes pixels and data lines. The peripheral area is disposed outside the display area. The pad portion is disposed in the peripheral area. The bending area is disposed in the peripheral area. The bending area is bendable or in a bent state. The first crack detection circuit is disposed between the display area and the pad portion. The first crack detection circuit includes switches. The first crack detection line includes a first curved portion disposed in the bending area. The first crack detection line is connected between the pad portion and the first crack detection circuit.

25 Claims, 22 Drawing Sheets

(51) Int. Cl.
*G02F 1/1333* (2006.01)
*G01R 31/02* (2006.01)
*H01L 21/66* (2006.01)
*G09G 3/00* (2006.01)

(52) U.S. Cl.
CPC ........ *H01L 27/124* (2013.01); *H01L 27/1255* (2013.01); *G09G 2300/0426* (2013.01); *G09G 2300/0452* (2013.01); *G09G 2330/12* (2013.01)

(58) Field of Classification Search
CPC .. H01L 27/1255; H01L 27/32–27/3293; H01L 2021/775; H01L 27/3297; H01L 2227/32; H01L 51/0097; H01L 51/50; H01L 2251/50; H01L 2251/5338; H01L 2251/568; H01L 2924/12044; H01L 2924/3512; H01L 2924/3511; H01L 2924/351; H01L 2924/386; G09G 3/006; G09G 2330/12; G09G 2300/0426; G09G 2300/0452
USPC ............. 257/48, 59, 88, 89, E23.01; 349/43; 438/30, 34
See application file for complete search history.

(56) References Cited

U.S. PATENT DOCUMENTS

| | | | | |
|---|---|---|---|---|
| 9,928,768 | B2* | 3/2018 | Kim | G09G 3/006 |
| 2003/0151587 | A1* | 8/2003 | Yamashita | G09G 3/006 345/102 |
| 2006/0170342 | A1 | 8/2006 | Kim et al. | |
| 2007/0030408 | A1* | 2/2007 | Lin | G02F 1/136204 349/40 |
| 2007/0146245 | A1 | 6/2007 | Goden et al. | |
| 2007/0146246 | A1 | 6/2007 | Nakamura et al. | |
| 2010/0006838 | A1* | 1/2010 | Yoshida | G09G 3/006 257/48 |
| 2014/0104251 | A1* | 4/2014 | Zhang | G09G 3/3611 345/205 |
| 2014/0176844 | A1* | 6/2014 | Yanagisawa | G02F 1/1309 349/43 |
| 2014/0319523 | A1 | 10/2014 | Lee | |
| 2015/0241501 | A1* | 8/2015 | Jang | G09G 3/3225 324/527 |
| 2016/0093685 | A1* | 3/2016 | Kwon | H01L 27/3276 257/40 |
| 2016/0210899 | A1 | 7/2016 | Hyun | |
| 2018/0053455 | A1* | 2/2018 | Zhang | G09G 3/006 |
| 2018/0108863 | A1* | 4/2018 | Kajiyama | H01L 51/5253 |

FOREIGN PATENT DOCUMENTS

| | | |
|---|---|---|
| KR | 10-1257565 | 4/2013 |
| KR | 10-2014-0045838 | 4/2014 |
| KR | 10-2014-0056659 | 5/2014 |
| KR | 10-2016-0089555 | 7/2016 |

OTHER PUBLICATIONS

Partial European Search Report dated Dec. 14, 2017, in European Patent Application No. 17193356.7.

* cited by examiner

FIG. 22

DISPLAY DEVICE

CROSS-REFERENCE TO RELATED APPLICATION

This application claims priority from and the benefit of Korean Patent Application No. 10-2016-0164328, filed Dec. 5, 2016, which is hereby incorporated by reference for all purposes as if fully set forth herein.

BACKGROUND

Field

The present disclosure relates to a display device. More particularly, the present disclosure relates to a display device that includes a bending area.

Discussion

A display device, such as a liquid crystal display (LCD), a light emitting diode display, a self-emissive display, and the like, typically include a display panel that includes a plurality of pixels that can display an image, and a plurality of signal lines. Each pixel usually includes a pixel electrode that receives a data signal, and the pixel electrode is connected with at least one transistor to receive the data signal. The display panel may include a plurality of stacked layers.

In manufacturing the display panel, a crack may occur in a substrate or a layer that is stacked on the substrate due to an impact applied to the display panel. The crack may gradually increase or may spread to another layer or another area, thereby causing a defect in the display panel. For example, if a crack occurs in a signal line, such as a data line or a scan line, a short-circuit may occur or resistance may increase, and moisture and the like may permeate into the display panel, thereby deteriorating reliability of a light emission element. Several issues may arise, such as the pixels of the display panel may not emit light or erroneous light may be emitted. Also, a flexible display may be intentionally twisted or bent in use, and once a minute crack occurs in the substrate or a layer stacked on the substrate of the display panel, the crack may gradually increase as the display panel is further twisted or bent in use.

The above information disclosed in this section is only for enhancement of an understanding of the background of the inventive concepts, and, therefore, it may contain information that does not form prior art already known to a person of ordinary skill in the art.

SUMMARY

One or more exemplary embodiments provide a display panel including a bending area and an edge area other than the bending area. Defects, such as a crack, may occur in the bending area or the edge area when the display panel is bent, flexed, twisted, etc. One or more exemplary embodiments enable detection of defects in the bending area or the edge area.

Additional aspects will be set forth in the detailed description which follows, and, in part, will be apparent from the disclosure, or may be learned by practice of the inventive concepts.

According to one or more exemplary embodiments, a display device includes a display area, a peripheral area, a pad portion, a bending area, a first crack detection circuit, and a first crack detection line. The display area includes pixels and data lines. The peripheral area is disposed outside the display area. The pad portion is disposed in the peripheral area. The bending area is disposed in the peripheral area. The bending area is bendable or in a bent state. The first crack detection circuit is disposed between the display area and the pad portion. The first crack detection circuit includes switches. The first crack detection line includes a first curved portion disposed in the bending area. The first crack detection line is connected between the pad portion and the first crack detection circuit.

According to one or more exemplary embodiments, a display device includes a display area, a peripheral area, a bending area, a first crack detection line, and a second crack detection line. The display area includes pixels and data lines. The peripheral area is disposed outside the display area. The bending area is disposed in the peripheral area. The bending area is bendable or in a bent state. The first crack detection line is disposed in the bending area. The second crack detection line is disposed in the peripheral area in a region at a periphery of at least one side of the display area.

According to one or more exemplary embodiments, defects (e.g., a crack) that may occur in a bending area of a display device or an edge area of the display device other than the bending area can be detected.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIGS. 19, 20, 21, and 22 are plan views of display devices including display panels according to various exemplary embodiments.

DETAILED DESCRIPTION OF THE ILLUSTRATED EMBODIMENTS

Figure 1:
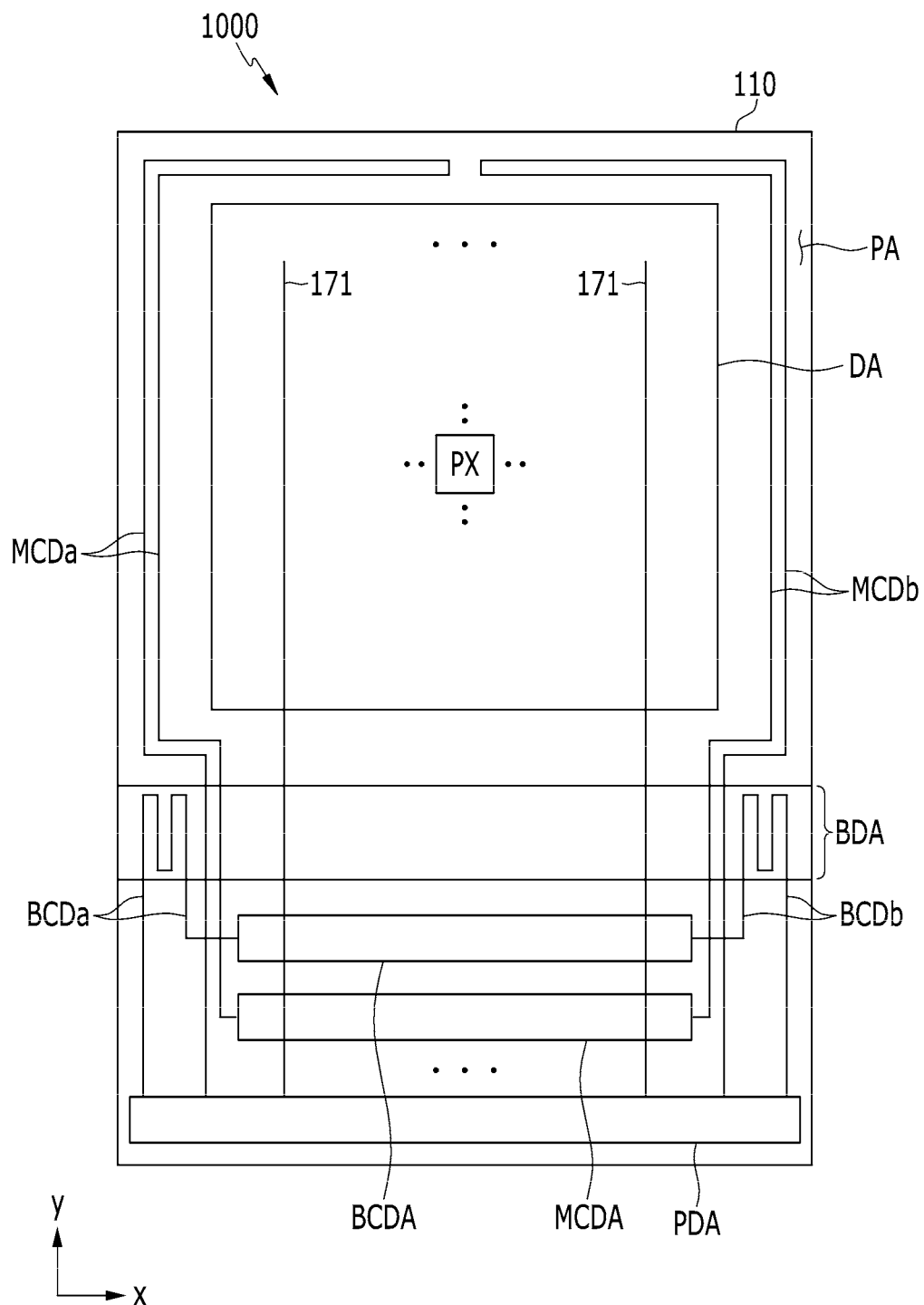
FIG. 1 is a schematic plan view of a display device including a display panel according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, aspects, etc. (hereinafter collectively referred to as "elements"), of the various illustrations may be otherwise combined, separated, interchanged, and/or rearranged without departing from the disclosed exemplary embodiments.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying figures, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
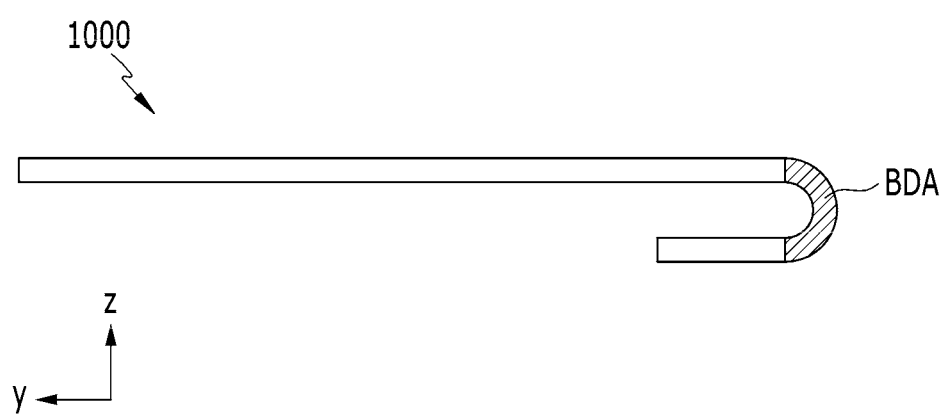
FIG. 2 is a schematic side view of the display device of FIG. 1 in a bent state according to one or more exemplary embodiments.

FIG. 1 is a schematic plan view of a display panel of a display device according to one or more exemplary embodiments. FIG. 2 is a schematic side view of the display device of FIG. 1 in a bent state according to one or more exemplary embodiments.

Referring to FIGS. 1 and 2, a display device 1000 includes a display area DA and a peripheral area PA. The peripheral area PA is disposed outside the display area DA. It is noted that the display device 1000 may be or include a display panel. For convenience, the display device 1000 will, hereinafter, be described as a display panel 1000. The display panel 1000 may be a standalone device, incorporated as part of another device, connected to another device, or otherwise associated with another device.

The display area DA includes a plurality of pixels PX and a plurality of signal lines. The display area DA may display an image on a plane that is parallel to an xy plane. For descriptive and illustrative convenience, a structure viewed in a direction (e.g., z-axis direction) that is perpendicular to the x-axis direction and the y-axis direction will be referred to as a planar structure, and a structure viewed when cut in a direction that is perpendicular to the x-axis direction or the y-axis direction will be referred to as a cross-sectional structure.

The signal lines include a plurality of gate lines (not shown) that transmit a gate signal and a plurality of data lines 171 that transmit a data signal. Each data line 171 substantially extends in the y-axis direction in the display area DA, and may be connected to a pad portion PDA in the peripheral area PA by extending to the peripheral area PA.

Each pixel PX may include at least one switch (not shown) and a pixel electrode (not shown) connected to the switch. The switch may be a three terminal element, such as a transistor, integrated with the display panel 1000. The switch may selectively transmit a data signal to the pixel electrode by being turned on or turned off according to a gate signal transmitted by the gate line.

To realize a color display, each pixel PX may display one of a plurality of given colors, and an image of a desired color can be recognized by a sum of the given colors, which may be provided temporally and/or spatially. As an example of the given colors that may be displayed by the plurality of pixels PX, three primary colors of red, green, and blue may be utilized, or three primary colors of yellow, cyan, and magenta may be utilized. To this end, at least one other color, such as white, may be further be included in addition to the three primary colors. It is contemplated, however, that any suitable combination of colors may be utilized in association with exemplary embodiments.

The display panel 1000 may further include a substrate 110 where the pixel PX and the signal line are formed. The substrate 110 may include glass, plastic, and the like, and may have flexibility. For example, the substrate 110 may include various types of plastic, such as polyethylene terephthalate (PET), polyethylene naphthalate (PEN), polycarbonate (PC), polyarylate (PAR), polyetherimide (PEI), polyethersulfone (PES), polyimide (PI), and the like, a metal thin film, an ultra-thin glass, etc.

The peripheral area PA may include a pad portion PDA, a bending area BDA, main crack detection lines MCDa and MCDb, bending crack detection lines BCDa and BCDb, a main crack detection circuit MCDA, and a bending crack detection circuit BCDA.

The pad portion PDA may be provided in one edge of the display panel 1000, and may include a plurality of pads (not shown) that can be electrically connected with a pad of a driving chip (not shown) or a circuit film (not shown). Although it is not illustrated, the display device may further include a driving chip or a circuit film that is electrically connected with the display panel 1000 through the pad portion PDA. The circuit film may be provided as a film and may include a driving chip attached thereto. A driving chip that is disposed on the display panel 1000 or disposed on the circuit film may include a data driver (not shown) and a timing controller (not illustrated). The data driver generates a data signal for driving the pixels PX, and may transmit various driving voltages to the display panel 1000.

The bending area BDA may extend in the x-axis direction while crossing the display panel 1000, e.g., longitudinally extend in the x-axis direction with a width in the y-axis direction. It is also contemplated that the bending area BDA may longitudinally extend in both the x-axis direction and the y-axis direction, e.g., the bending area BDA may cross the display panel 1000 in a diagonal manner. Further, the bending area BDA may have a curve shape, e.g., the bending area BDA may cross the display panel 1000 in an arcuate manner. FIG. 1 shows the display panel 1000 in an unfolded state rather than being bent in the bending area BDA. FIG. 2 shows the display panel 1000 in the bent state in the bending area BDA.

Referring to FIG. 2, the display panel 1000 is bent in the bending area BDA such that a portion of the peripheral area PA disposed outside of the bending area BDA is bent backward under the display panel 1000, and thus, may not be visible from a front side view, e.g., a plan view in the z-axis direction. A plurality of wires may disposed in the bending area BDA, and the plurality of wires may substantially extend in the y-axis direction in the bending area BDA. At least a portion of the substrate 110 may be removed in the bending area BDA.

The main crack detection lines MCDa and MCDb may be provided at (or near) the periphery of the display area DA in the peripheral area PA. For instance, the main crack detection lines MCDa and MCDb may extend along edges of the display area DA and surround peripheral portions of the display area DA, e.g., the left side, the right side, and a portion of the top side of the display area DA. It is also contemplated that the main crack detection lines MCDa and MCDb may surround a portion of the bottom side of the display area DA.

For example, the main crack detection line MCDa may include a first portion that extends substantially in the y-axis direction along the left portion of the peripheral area PA of the display area DA and a second portion that extends from the first portion of the main crack detection line MCDa in substantially in the x-axis direction from the top-left portion of the peripheral area PA of the display area DA towards the top-right portion of the peripheral area PA of the display area DA. The main crack detection line MCDa may also include a third portion that extends from the first portion of the main crack detection line MCDa in substantially in the x-axis direction from the bottom-left portion of the peripheral area PA towards the bottom-right portion of the peripheral area PA. The main crack detection line MCDb includes a first portion that extends substantially in the y-axis direction along the right portion of the peripheral area PA of the display area DA and a second portion that extends from the first portion of the main crack detection line MCDb in substantially the x-axis direction from the top-right portion of the peripheral area PA of the display area DA towards the top-left portion of the peripheral area PA of the display area DA. The main crack detection line MCDb may also include a third portion that extends from the first portion of the main crack detection line MCDb in substantially in the x-axis direction from the bottom-right portion of the peripheral area PA towards the bottom-left portion of the peripheral area PA.

The main crack detection lines MCDa and MCDb extend along the periphery of the display area DA in the peripheral area PA after passing through the bending area BDA from the pad portion PDA, form a back-and-forth bent portion in the left and right sides of the display area DA and/or in the upper peripheral area PA from the pad portion PDA, and then may be connected to the main crack detection circuit MCDA after passing through the bending area BDA again. As such, a first end of each of the main crack detection lines MCDa and MCDb is connected with the pad portion PDA, and thus, may receive a test voltage, and a second end of each of the main crack detection lines MCDa and MCDb may be connected with the main crack detection circuit MCDA. Differing from as illustrated, the left and right main crack detection lines MCDa and MCDb may be connected with each other in an upper side of the display area DA or an upper portion of the peripheral area PA.

The main crack detection lines MCDa and MCDb may include at least one contact portion (not shown) that is provided at a vertical periphery of the bending area BDA, e.g., at a periphery of the bending area BDA that is disposed closer to the display area DA than a periphery of the bending area BDA that is disposed closer to the pad portion PDA. The main crack detection lines MCDa and MCDb may include portions that are disposed in different layers with reference to the contact portion of the main crack detection lines MCDa and MCDb in a cross-sectional view. The contact portion of the main crack detection lines MCDa and MCDb may include at least one contact hole.

The bending crack detection lines BCDa and BCDb may respectively include portions that are provided in left and right edge areas of the bending area BDA and substantially extend in the y-axis direction. The bending crack detection lines BCDa and BCDb may be connected to the bending crack detection circuit BDCA after forming a bent back-and-forth bent portion in the bending area BDA from the pad portion PAD. A first end of each of the bending crack detection lines BCDa and BCDb is connected with the pad portion PDA, and thus, may receive a test voltage, and a second end of each of the bending crack detection lines BCDa and BCDb may be connected with the bending crack detection circuit BCDA.

In the bending area BDA, the bending crack detection line BCDa may be provided between the main crack detection line MCDa and a first edge (e.g., left edge) of the substrate 110. The first edge of the substrate 110 may be the same as a first outer edge (e.g., outer left edge) of the peripheral area PA. Likewise, the bending crack detection line BCDb may be provided between the main crack detection line MCDb and a second edge (e.g., right edge) of the substrate 110 that may be the same as a second outer edge (e.g., outer right edge) of the peripheral area PA in the bending area BDA.

The bending crack detection lines BCDa and BCDb may include at least one contact portion (not shown) that is provided at the vertical periphery of the bending area BDA, and may include portions that are disposed in different layers with reference to the contact portion of the bending crack detection lines BCDa and BCDb in a cross-sectional view. The contact portion of the bending crack detection lines BCDa and BCDb may include at least one contact hole.

The bending crack detection circuit BCDA may be provided between the bending area BDA and the main crack detection circuit MCDA on a plane, but exemplary embodiments are not limited thereto or thereby. Differing from as illustrated, at least one of the main crack detection circuit MCDA and the bending crack detection circuit BCDA may be provided between the bending area BDA and the display area DA, or the main crack detection circuit MCDA may be provided between the bending area BDA and the bending crack detection circuit is BCDA. It is also contemplated that the main crack detection circuit MCDA and the bending crack detection circuit BCDA may form portions of a larger circuit structure.

The main crack detection lines MCDa and MCDb and the main crack detection circuit MCDA may sense defects (or conditions leading to defects) that may occur in the substrate 110 or layers that are stacked on the substrate 110, such as cracks, lifting, and the like, through a change of resistance of the main crack detection lines MCDa and MCDb in the peripheral area PA of the display panel 1000. The change in resistance of the main crack detection lines MCDa and MCDb can be determined by checking the light emitting state of one or more pixels PX in the display area DA through the main crack detection circuit MCDA. It is contemplated, however, that any other suitable manner to detect the change in resistance of the main crack detection lines MCDa and MCDb may be utilized.

The bending crack detection lines BCDa and BCDb and the bending crack detection circuit BCDA may sense defects (or conditions leading to defects) that may occur in the edge area of the bending area BDA, such as cracks, lifting, and the like, through a resistance change of the bending crack detection lines BCDa and BCDb. The change in resistance of the bending crack detection lines BCDa and BCDb can be determined by checking the light emitting state of one or more pixels PX in the display area DA through the bending crack detection circuit BCDA. It is contemplated, however, that any other suitable manner to detect the change in resistance of the bending crack detection lines BCDa and BCDb may be utilized.

Further details of the display panel 1000 will be described with reference to FIGS. 3 to 6 together with FIGS. 1 and 2. Hereinafter, the same constituent elements as previously described are given the same reference numerals and duplicative descriptions will be omitted.

Figure 3:
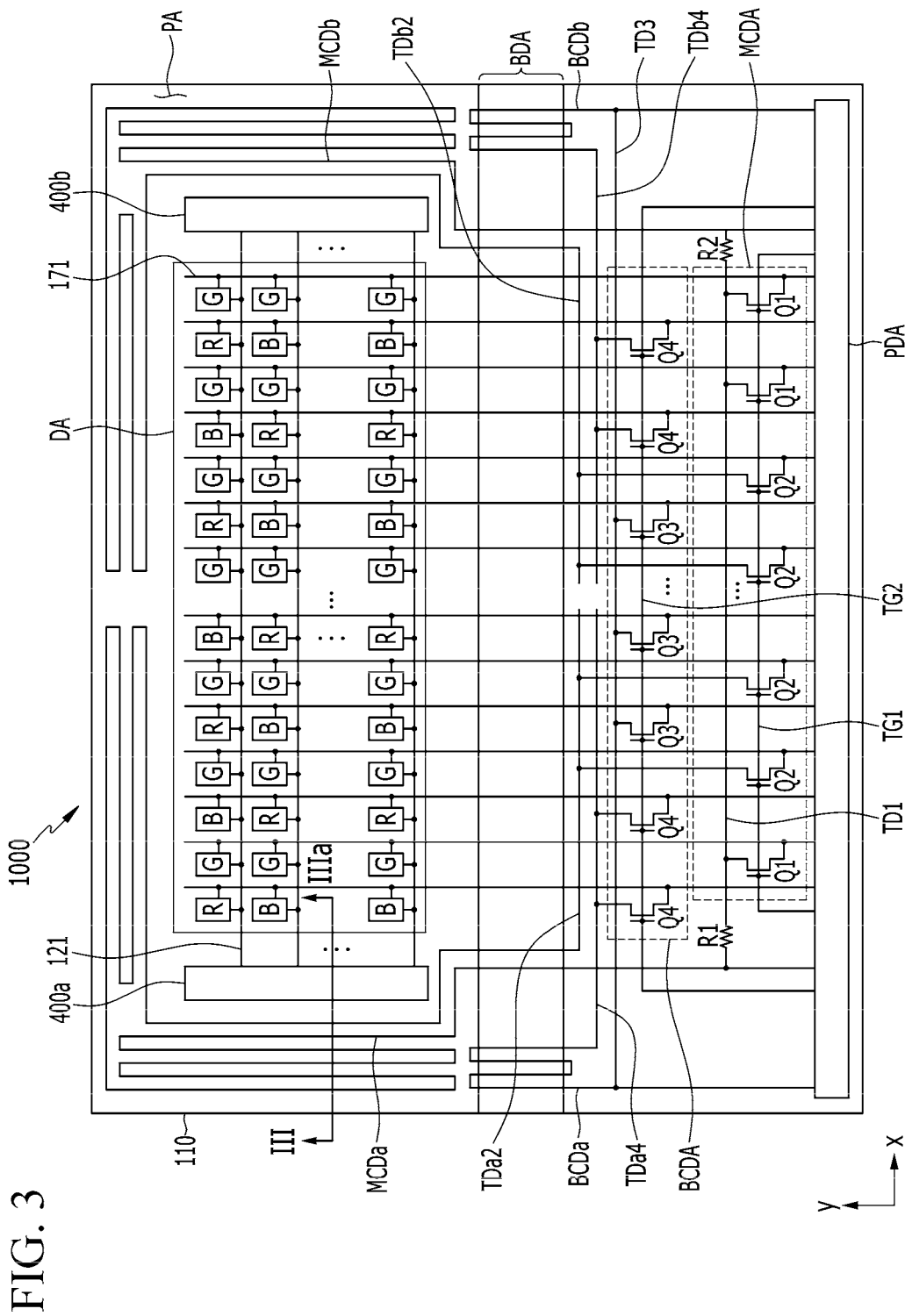
FIG. 3 is a plan view of the display device of FIG. 1 according to one or more exemplary embodiments.
Figure 4:
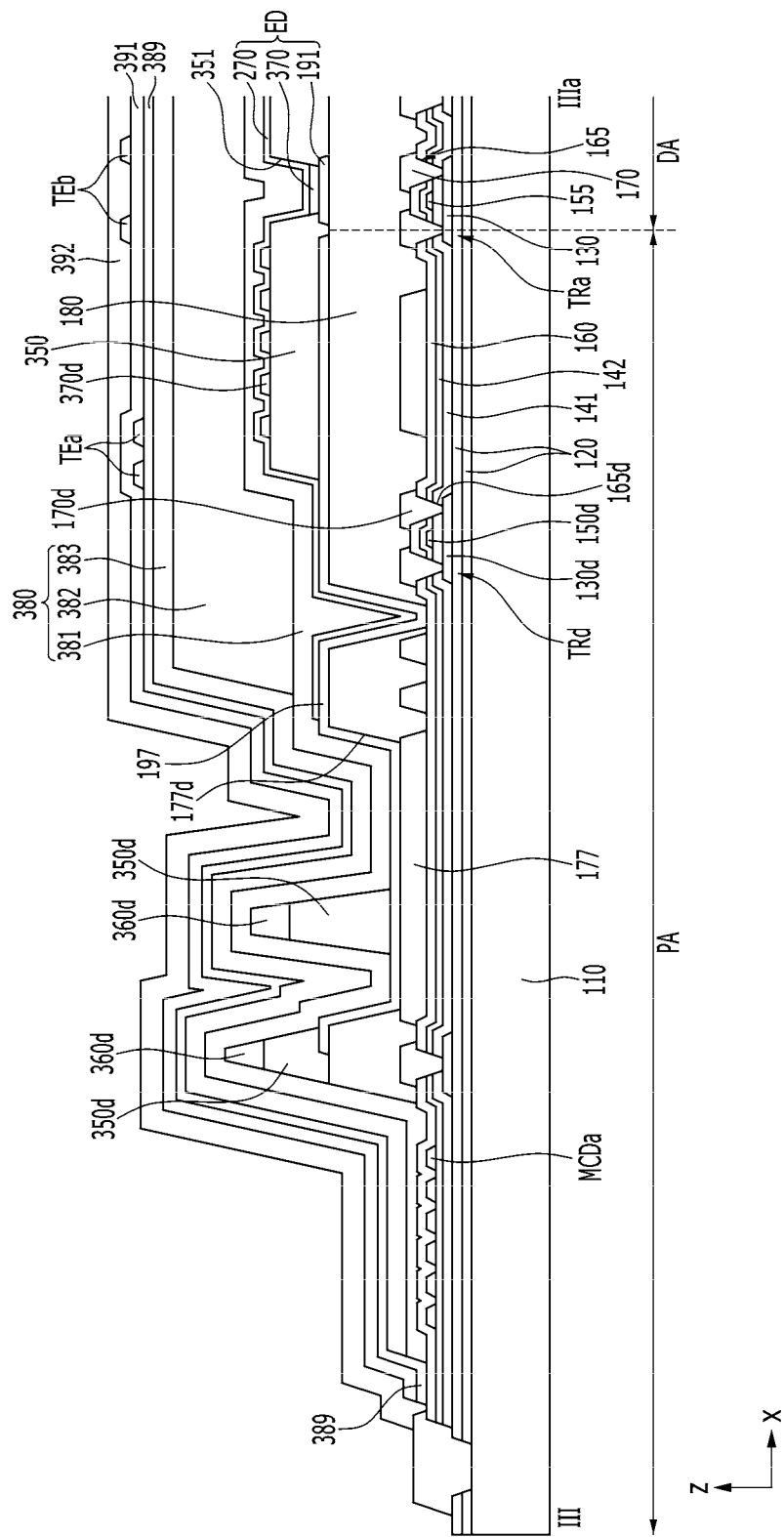
FIG. 4 is a cross-sectional view of the display device of FIG. 3 taken along sectional line III-IIIa according to one or more exemplary embodiments.

FIG. 3 is a plan view of the display device of FIG. 1 according to one or more exemplary embodiments. FIG. 4 is a cross-sectional view of the display device of FIG. 3 taken along sectional line III-IIIa according to one or more exemplary embodiments. As such, FIG. 3 provides a planar structure of the display panel 1000 and FIG. 4 provides a cross-sectional structure of the display panel 1000.

Referring to FIG. 3, the plurality of pixels PX that are provided in the display area DA may display specific colors, for example, red, green, and blue. Four pixels that are adjacent to each other in a quadrangular shape may include two green pixels G, one red pixel R, and one blue pixel B. A pixel column that includes only the green pixel G and a pixel column that includes the red pixel R and the blue pixel B may be alternately arranged in the x-axis direction, and the red pixels R and the blue pixels B may be alternately arranged in the y-axis direction in each pixel column including the red pixels R and the blue pixels B. However, the arrangement of the plurality of pixels PX is not limited to the above-stated arrangement, and may have any suitable arrangement.

The plurality of signal lines that are disposed in the display area DA may further include a plurality of gate lines 121 that transmit a gate signal. Each of the plurality of gate lines 121 may extend substantially in the x-axis direction and may cross the data lines 171 in an insulated manner. Each of the pixels R, G, and B may be connected with one data line 171 and at least one gate line 121.

The display panel 1000 may further include gate drivers 400a and 400b that are provided in the peripheral area PA and apply a gate signal by being connected with the plurality of gate lines 121. The gate drivers 400a and 400b may be provided on the substrate 110 together with the plurality of signal lines and a switching element provided in the display area DA. In FIG. 3, the gate drivers 400a and 400b are provided in the left side and the right side with respect to the display area DA, but exemplary embodiments are not limited thereto or thereby. One of the gate drivers 400a and 400b disposed in one side with respect to the display area DA may be omitted or may be disposed in another area of the peripheral area PA.

Referring to FIG. 3, the main crack detection lines MCDa and MCDb may respectively include meandering-shaped bent portions formed in back-and-forth patterns in the outer peripheral area PA of the display area DA, e.g., in the left and right portions of the peripheral area PA and/or in the upper portion of the peripheral area PA. For instance, each of the main crack detection lines MCDa and MCDb may include one or more meandering-shaped bent portions formed vertically in back-and forth patterns in the left and right portions of the peripheral area PA of the display area DA, and may include one or more meandering-shaped bent portions formed horizontally in back-and-forth patterns in the upper portion of the peripheral area PA of the display area DA.

A first end of each of the main crack detection lines MCDa and MCDb is connected with the pad portion PDA, and second ends of each of the main crack detection lines MCDa and MCDb is respectively connected to test data lines TDa2 and TDb2. A first end of the test data line TDa2 connected with the main crack detection line MCDa and a first end of the test data line TDb2 connected with the main crack detection line MCDb are disposed opposing each other at a distance from each other such that they may not be electrically connected with each other. The respective test data lines TDa2 and TDb2 may substantially extend in the x-axis direction in a region between the bending area BDA and the pad portion PDA, and may cross the data lines 171 in an insulated manner.

The main crack detection circuit MCDA may include a test data line TD1. The test data line TD1 may substantially extend in the x-axis direction in a region between the bending area BDA and the pad portion PDA, and may cross the data lines 171 in an insulated manner. The test data line TD1 may be connected with the pad portion PDA. As shown in FIG. 3, the test data line TD1 may be connected with a first end portions of each of the main crack detection lines MCDa and MCDb, the first end portions of the main crack detection lines MCDa and MCDb are connected with the pad portion PDA. The main crack detection lines MCDa and MCDb and the test data line TD1 may receive substantially the same test voltage from the pad portion PDA.

The main crack detection circuit MCDA may further include a plurality of switches Q1 and Q2 and a test gate line TG1. The plurality of switches Q1 and Q2 may be substantially arranged in one row in the x-axis direction, and may respectively correspond to a part of the plurality of data lines 171. For instance, the switches Q1 and Q2 may be provided every two data lines 171. The test gate line TG1 may substantially extend in the x-axis direction.

Gate terminals of the switches Q1 and Q2 are connected to the test gate line TG1, and output terminals of the switches Q1 and Q2 are connected to a corresponding data line 171 of the data lines 171. Colors represented by pixels in the display area DA connected with the data lines 171 to which the switches Q1 and Q2 are connected may include a specific color. For example, as shown in FIG. 3, the pixels connected with data lines 171 to which the switches Q1 and Q2 are connected in the display area DA may all be green pixels G, but exemplary embodiments are not limited thereto or thereby. An input terminal of the switch Q1 is connected with the test data line TD1, and an input terminal of the switch Q2 is connected with the test data lines TDa2 and TDb2.

The switch Q2 may be disposed in a part of the main crack detection circuit MCDA, for example, a left part area and a right part area of the display panel 1000, and the switch Q1 may be disposed in a remaining area of the main crack detection circuit MCDA. The plurality of switches Q2 may be disposed adjacent to each other in the x-axis direction in the area including the switch Q2. However, the arrangement of the switches Q1 and Q2 is not limited thereto or thereby.

Referring to FIG. 3, matching resistors R1 and R2 may be connected between the pad portion PDA and the test data line TD1. After the test voltage applied through the pad portion PDA is reduced by a first voltage difference through the matching resistors R1 and R2, the reduced test voltage is applied to the test data line TD1 and then applied to the input terminal of the switch Q1. The test voltage applied through the pad portion PDA is also transmitted to the main crack detection lines MCDa and MCDb, and a voltage reduced by a second voltage difference due to wire resistance of the MCDa and MCDb may be applied to the input terminal of the switch Q2 of the main crack detection circuit MCDA through the test data lines TDa2 and TDb2. Resistance values of the matching resistors R1 and R2 may be equivalent or similar to the wire resistance of the main crack detection lines MCDa and MCDb. Alternatively, when the main crack detection lines MCDa and MCDb are in a normal state, and thus, no crack or lifting occurs therein, the first voltage difference and the second voltage difference may be set to be substantially equivalent to each other or correspond to each other. However, exemplary embodiments are not limited thereto or thereby. For instance, the resistance values of the matching resistors R1 and R2 may be set to appropriate values based on, for instance, crack detection sensitivity, and the like. For example, the resistance values of the matching resistors R1 and R2 may be set to be approximately 1.5 times the wire resistance of the main crack detection lines MCDa and MCDb.

Referring to FIG. 3, the bending crack detection lines BCDa and BCDb may respectively include meandering-shaped bent portions formed vertically back-and-forth in the left and right edge portions of the bending area BDA. A first end of each of the bending crack detection lines BCDa and BCDb is connected to the pad portion PDA, and a second end of each of the bending crack detection lines BCDa and BCDb is connected with the test data lines TDa4 and TDb4, respectively. First end of the test data line TDa4 connected with the bending crack detection line BCDa and first end of the test data line TDb4 connected with the bending crack detection line BCDb may be disposed facing each other at a distance from each other, and thus, may not be electrically connected with each other. The test data lines TDa4 and TDb4 may substantially extend in the x-axis direction in a region between the bending area DBA and the pad portion PDA, and may cross the data lines 171 in an insulated manner.

The bending crack detection circuit BCDA may include a test data line TD3. The test data line TD3 may substantially extend in the x-axis direction in a region between the bending area BDA and the pad portion PDA, and may cross the data lines 171 in an insulated manner. The test data line TD3 may be connected with the pad portion PDA. As shown in FIG. 3, the test data line TD3 may be connected with a first end portions of each of the bending crack detection lines BCDa and BCDb, the first end portions of the bending crack detection lines BCDa and BCDb being connected with the pad portion PDA. The bending crack detection lines BCDa and BCDb and the test data line TD3 may substantially receive the same test voltage from the pad portion PDA.

The bending crack detection circuit BCDA may further include a plurality of switches Q3 and Q4 and a test gate line TG2. The plurality of switches Q3 and Q4 may be substantially arranged in one row in the x-axis direction, and each may correspond to a part of the plurality of data lines 171. For instance, the switches Q3 and Q4 may each be provided every two data lines 171. The test gate line TG2 may substantially extend in the x-axis direction.

Gate terminals of the switches Q3 and Q4 are connected with the test gate line TG2, and output terminals of the switches Q3 and Q4 are connected with corresponding data lines 171. Colors represented by pixels in the display area DA connected with the data lines 171 to which the switches Q3 and Q4 are connected may include one or two specific colors. For example, as shown in FIG. 3, a pixel column connected with the data lines 171 to which the switches Q3 and Q4 are connected in the display area DA may be a pixel column in which a red pixel R and a blue pixel B are alternately arranged, but exemplary embodiments are not limited thereto or thereby. An input terminal of the switch Q3 is connected with the test data line TD3, and an input terminal of the switch Q4 is connected with the test data lines TDa4 and TDb4.

The switches Q4 may be disposed in parts of the bending crack detection circuit BCDA, for example, a part of the left region and a part of the right region of the display panel 1000, and the switches Q3 may be disposed in the rest of the region the bending crack detection circuit BCDA. The plurality of switches Q4 may be disposed adjacent to each other in the x-axis direction in the regions where the switches Q4 are disposed. However, the arrangement of the switches Q3 and Q4 are not limited thereto or thereby.

With continued reference to FIG. 3, the switches Q1 and Q2 in the main crack detection circuit MCDA and the switches Q3 and Q4 in the bending crack detection circuit BCDA may be sequentially connected to the plurality of data lines 171 that are arranged in the x-axis direction. That is, the switches Q1 and Q2 in the main crack detection circuit MCDA and the switches Q3 and Q4 in the bending crack detection circuit BCDA may be alternately arranged in the x-axis direction.

Although it is not illustrated, a matching resistor may be connected between the pad portion PDA and the test data line TD3. However, such a matching resistor may be omitted when wiring resistance of the bending crack detection lines BCDa and BCDb is not high.

Referring to FIG. 4, but with continued reference to FIGS. 1 to 3, a barrier layer 120 may be provided on the substrate 110. As shown in FIG. 4, the barrier layer 120 may include a plurality of layers. It is contemplated, however, that the barrier layer 120 may be provided as a single layer.

An active pattern is provided on the barrier layer 120. The active pattern may include an active pattern 130 that is disposed in the display area DA and an active pattern 130d that is disposed in the peripheral area PA. The active patterns 130 and 130d may respectively include source regions and drain regions, and channel regions disposed between the source regions and the drain regions. The active patterns 130 and 130d may include amorphous silicon, polysilicon, or an oxide semiconductor; however, exemplary embodiments are not limited thereto or thereby.

A first insulation layer 141 is provided on the active patterns 130 and 130d, and a first conductive layer may be provided on the first insulation layer 141. The first conductive layer may include a conductor 155 that overlaps the active pattern 130 that is disposed in the display area DA, a conductor 150d that overlaps the active pattern 130d that is disposed in the peripheral area DA, the above-described plurality of gate lines 121, and test gate lines TG1 and TG2.

The active pattern 130 and the conductor 155 of the first conductive layer overlapping the active pattern 130 may form a transistor TRa. The active pattern 130d and the conductor 150d of the first conductive layer overlapping the active pattern 130d may form a transistor TRd. The transistor TRa may serve as a switch included in the pixels PX (e.g., the R, G, and B pixels) that are disposed in the display area DA, and the transistor TRd may serve as a switch (not shown) included, for example, in the gate drivers 400a and 400b, or may serve as a plurality of switches Q1, Q2, Q3, and Q4 that are included in the main crack detection circuit MCDA or in the bending crack detection circuit BCDA. An example of a structure of the pixel PX will be described later in association with FIGS. 5 and 6.

A second insulation layer 142 may be provided on the first conductive layer and the first insulation layer 141. A second conductive layer may be provided on the second insulation layer 142. The second conductive layer may include the above-stated main crack detection lines MCDa and MCDb. Alternatively, the main crack detection lines MCDa and MCDb may be disposed in the same layer as the first conductive layer, and may include the same material as the first conductive layer. The second conductive layer may further include the above-stated test data lines TD1, TDa2, TDb2, TD3, TDa4, and TDb4. Alternatively, at least one of the test data lines TD1, TDa2, TDb2, TD3, TDa4, and TDb4 may be disposed on the first conductive layer. At least one of the first conductive layer and the second conductive layer may include a metal, such as copper (Cu), aluminum (Al), molybdenum (Mo), and an alloy thereof.

A third insulation layer 160 may be provided on the second conductive layer and the second insulation layer 142.

At least one of the first insulation layer 141, the second insulation layer 142, and the third insulation layer 160 may include an inorganic insulation material, such as a silicon nitride (SiNx), a silicon oxide (SiOx), and the like, and/or an organic insulation material. At least one of the first insulation layer 141, the second insulation layer 142, and the third insulation layer 160 may be partially removed in the bending area BDA. The first insulation layer 141, the second insulation layer 142, and the third insulation layer 160 may include contact holes 165 and 165d that are respectively formed on the source regions and/or the drain regions of the transistors TRa and TRd.

A third conductive layer may be disposed on the third insulation layer 160. The third conductive layer may include conductors 170 and 170d that are respectively connected with the source regions or the drain regions of the transistors TRa and TRd through the contact holes 165 and 165d, a voltage transmission line 177, and the above-stated data lines 171. The voltage transmission line 177 may be disposed in the peripheral area PA, and may transmit a constant voltage like, such as a common voltage ELVSS.

The third conductive layer may include metals, such as copper (Cu), aluminum (Al), and molybdenum (Mo), or alloys thereof.

A passivation layer 180 is provided on the third conductive layer and the third insulation layer 160. The passivation layer 180 may include an inorganic insulation material and/or an organic insulation material, such as a polyacrylic resin, and the like. An upper surface of the passivation layer 180 may be substantially flat. In this manner, the passivation layer 180 may also function as a planarization layer. The passivation layer 180 may include a contact hole 177d disposed on the voltage transmission line 177 that is disposed in the peripheral area PA.

A pixel electrode layer is provided on the passivation layer 180. The pixel electrode layer may include a pixel electrode 191 that respectively corresponds to each pixel PX, and a voltage transmission electrode 197 that is disposed in the peripheral area PA. The voltage transmission electrode 197 is physically and electrically connected with the voltage transmission line 177 through the contact hole 177d of the passivation layer 180, and thus, receives the common voltage ELVSS. The pixel electrode layer may include a conductive transparent material and/or a conductive material that is reflective.

A pixel defining layer 350 is provided on the passivation layer 180 and the pixel electrode layer. The pixel defining layer 350 includes an opening 351 that is provided on the pixel electrode 191, and may further include at least one dam portion 350d that is disposed in the peripheral area PA. The dam portion 350d may extend in parallel with an edge of the substrate 110 on a plane. A portion of the dam portion 350d may be disposed in contact hole 177d. A spacer 360d may be further provided on the dam portion 350d.

Referring to FIGS. 3 and 4, main crack detection lines MCDa and MCDb may be disposed in an outer region of the peripheral area PA such that the dam portion 350d is disposed between the main crack detection lines MCDa and MCDb and the display area DA, but exemplary embodiments are not limited thereto or thereby. For instance, the main crack detection lines MCDa and MCDb may be disposed in an inner region of the peripheral area PA such that the main crack detection lines MCDa and MCDb are disposed between the dam portion 350d and the display area DA.

The voltage transmission electrode 197 includes a portion that is not covered by the pixel defining layer 350. That is, the voltage transmission electrode 197 may be exposed by contact hole 177d in the pixel defining layer 350. The pixel defining layer 350 may include a photosensitive material, such as a polyacrylate resin, a polyimide resin, and the like.

An emission layer 370 is provided on the pixel electrode 191. The emission layer 370 may include a portion that is disposed in the opening 351 of the pixel defining layer 350. The emission layer 370 may further include at least one dummy emission layer 370d that is provided in the peripheral area PA and disposed on the pixel defining layer 350. The emission layer 370 may include an organic emission material or an inorganic emission material.

A common electrode 270 is provided on the emission layer 370. The common electrode 270 is also provided on the pixel defining layer 350, and thus, may be continuously formed throughout the plurality of pixels PXs. The common electrode 270 is physically and electrically connected with the voltage transmission electrode 197 in the peripheral area PA, and thus, receives the common voltage ELVSS. The common electrode 270 may include a conductive transparent material.

The pixel electrode 191, the emission layer 370, and the common electrode 270 of each pixel PX forms an emission diode ED with one of the pixel electrode 191 and the common electrode 270 functioning as a cathode and the other functioning as an anode.

An encapsulation portion 380 protects (or reduces damage to) the emission diode ED by encapsulating the emission diode ED. The encapsulation portion 380 may be disposed on the common electrode 270. The encapsulation portion 380 includes at least one of inorganic layers 381 and 383 and at least one organic layer 382, and the at least one of the inorganic layers 381 and 383 and the at least one organic layer 382 may be alternately stacked. The organic layer 382 includes an organic material and may have a planarization characteristic. The inorganic layers 381 and 383 may include an inorganic material, such as an aluminum oxide (AlOx), a silicon oxide (SiOx), a silicon nitride (SiNx), and the like.

A planar area of the inorganic layers 381 and 383 may be wider than a planar area of the organic layer 382, and thus, two inorganic layers 381 and 383 may contact each other in the peripheral area PA. The lowest inorganic layer among the two inorganic layers 381 and 383 may contact an upper surface of the third insulation layer 160 in the peripheral area PA, but exemplary embodiments are not limited thereto or thereby. The encapsulation portion 380 that includes the inorganic layers 381 and 383 may overlap the main crack detection lines MCDa and MCDb in the peripheral area PA on a plane.

An edge of the organic layer 382 included in the encapsulation portion 380 may be disposed between the dam portion 350d and the display area DA. The dam portion 350d may serve to prevent the organic material from flowing outside when the organic layer 382 of the encapsulation portion 380 is formed. As such, the edge of the organic layer 382 of the encapsulation portion 380 may be substantially disposed further inside (e.g., closer to the display area DA) than the dam portion 350d.

A buffer layer 389 that includes an inorganic insulation material and/or an organic insulation material may be provided on the encapsulation portion 380. The buffer layer 389 can be omitted.

A fourth conductive layer is provided on the buffer layer 389. The fourth conductive layer may include a first touch conductor TEa. A first touch insulation layer 391 is provided on the fourth conductive layer, and a fifth conductive layer may be provided on the first touch insulation layer 391. The fifth conductive layer may include a second touch conductor TEb. A second touch insulation layer 392 may be provided on the fifth conductive layer. The first touch conductor TEa and the second touch conductor TEb form a capacitive touch sensor to sense touch information, such as whether or a touch is made, a touch location, and the like, when a touch (or near touch) is made by an external object. The first touch conductor TEa and the second touch conductor TEb may be formed in a mesh shape.

An example structure of the pixel PX included in the display panel 1000 will be described in more detail with reference to FIGS. 5 and 6, together with the above-described FIGS. 1 to 4. The same constituent elements as previously described are given the same reference numerals and duplicative descriptions will be omitted.

Figure 5:
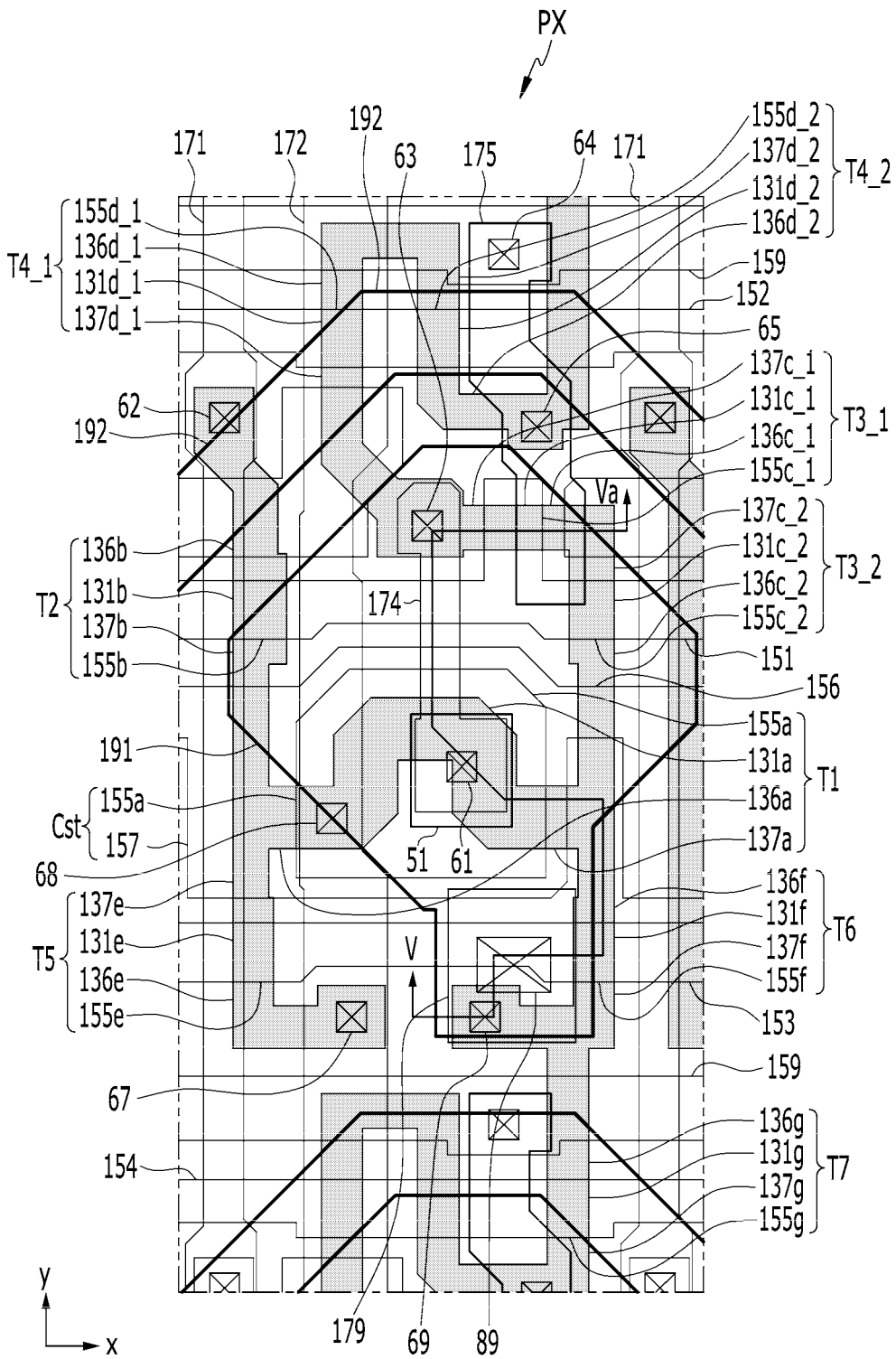
FIG. 5 is a layout view of a pixel of the display device of FIG. 1 according to one or more exemplary embodiments.

FIG. 5 is a layout view of a pixel of the display device of FIG. 1 according to one or more exemplary embodiments. FIG. 6 is a cross-sectional view of the display device of FIG. 5 taken along sectional line V-Va according to one or more exemplary embodiments.

Figure 6:
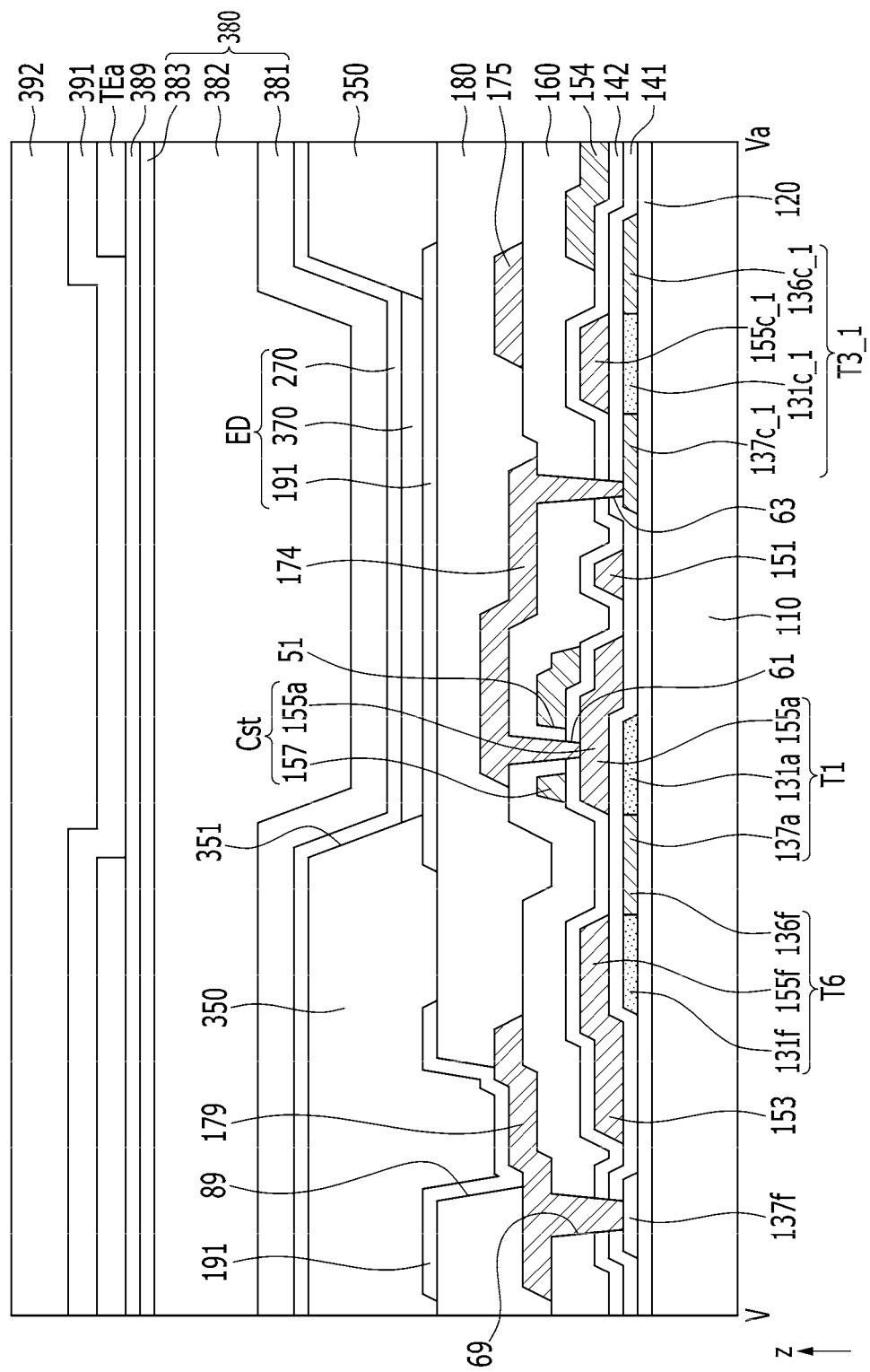
FIG. 6 is a cross-sectional view of the display device of FIG. 5 taken along sectional line V-Va according to one or more exemplary embodiments.

Referring to FIGS. 5 and 6, a pixel PX of the plurality of pixels PX of the display panel 1000 may be one of the above-stated red pixel R, green pixel G, and blue pixel B.

The display panel 1000 includes a first scan line 151 that transmits a first scan signal, a second scan line 152 that transmits a second scan signal, a third scan line 154 that transmits a third scan signal, and a control line 153 that transmits a light emission control signal. The first, second, and third scan lines 151, 152, and 154 and the control line 153 may be included in the above-described gate line 121, or may be included in the above-described first conductive layer on a cross-section.

The display panel 1000 may further include a storage line 156 and an initialization voltage line 159. The storage line 156 and the initialization voltage line 159 may be included in the above-described second conductive line on a cross-section. The storage line 156 may include an expansion portion 157 that is provided in each pixel PX. The initialization voltage line 159 may transmit an initialization voltage.

The display panel 1000 may further include data lines 171 and a driving voltage line 172. The data lines 171 and the driving voltage line 172 may be included in the above-described third conductive layer on a cross-section. The data lines 171 and the driving voltage lines 172 substantially extend in the same direction (e.g., the vertical (or y-axis) direction in FIG. 5) on a plane, and may cross the first, second, and third scan lines 151, 152, and 154 in an insulated manner. The expansion portion 157 of the storage line 156 is connected with the driving voltage line 172 through a contact hole 68, and thus, receives a driving voltage ELVDD.

Each pixel PX may include a plurality of transistors T1, T2, T3_1, T3_2, T4_1, T4_2, T5, T6, and T7 that are connected with the scan lines 151, 152, and 154, the control line 153, the data line 171, the driving voltage line 172, a capacitor Cst, and an emission diode ED. The plurality of transistors T1, T2, T3_1, T3_2, T4_1, T4_2, T5, T6, and T7 may be included in the above-described transistor TRa. A channel of each of the plurality of transistors T1, T2, T3_1, T3_2, T4_1, T4_2, T5, T6, and T7 may be provided in the above-described active pattern 130. The active pattern 130 includes channel regions 131a, 131b, 131c_1, 131c_2, 131d_1, 131d_2, 131e, 131f, and 131g that respectively form the channels of the respective transistors T1, T2, T3_1, T3_2, T4_1, T4_2, T5, T6, and T7 and conductive regions. The conductive regions of the active pattern 130 are disposed at lateral sides of each of the channel regions 131a, 131b, 131c_1, 131c_2, 131d_1, 131d_2, 131e, 131f, and 131g, and have higher carrier concentrations than those of the channel regions 131a, 131b, 131c_1, 131c_2, 131d_1, 131d_2, 131e, 131f, and 131g. A pair of conductive regions that are disposed at lateral sides of each of the channel regions 131a, 131b, 131c_1, 131c_2, 131d_1, 131d_2, 131e, 131f, and 131g of the transistors T1, T2, T3_1, T3_2, T4_1, T4_2, T5, T6, and T7 are source regions and drain regions of the corresponding transistors T1, T2, T3_1, T3_2, T4_1, T4_2, T5, T6, and T7, and may serve as source electrodes and drain electrodes, respectively.

The first transistor T1 includes the channel region 131a, a source region 136a, a drain region 137a, and a driving gate electrode 155a that overlaps the channel region 131a on a plane. The driving gate electrode 155a may be included in the above-described first conductive layer, and may be connected with a connection member 174 through a contact hole 61. The connection member 174 may be included in the above-described third conductive layer on a cross-section. The contact hole 61 may be disposed in a contact hole 51 that is included in the expansion portion 157.

The second transistor T2 includes the channel region 131b, a source region 136b, a drain region 137b, and a gate electrode 155b that overlaps the channel region 131b on a plane. The gate electrode 155b is a part of the first scan line 151. The source region 136b is connected with the data line 171 through a contact hole 62, and the drain region 137b is connected with the source region 136a of the first transistor T1.

The third transistors T3_1 and T3_2 may include an upper third transistor T3_1 and a lower third transistor T3_2 that are connected with each other. The upper third transistor T3_1 includes the channel region 131c_1, a source region 136c_1, a drain region 137c_1, and a gate electrode 155c_1 that overlaps the channel region 131c_1. The gate electrode 155c_1 may be a part of the first scan line 151. The drain region 137c_1 is connected with the connection member 174 through a contact hole 63. The lower third transistor T3_2 includes the channel region 131c_2, a source region 136c_2, a drain region 137c_2, and a gate electrode 155c_2 that overlaps the channel region 131c_2. The gate electrode 155c_2 is a part of the first scan line 151.

The fourth transistors T4_1 and T4_2 may include a left fourth transistor T4_1 and a right fourth transistor T4_2 that are connected with each other. The left fourth transistor T4_1 includes the channel region 131d_1, a source region 136d_1, a drain region 137d_1, and a gate electrode 155d_1 that overlaps the channel region 131d_1. The gate electrode 155d_1 is a part of the second scan line 152. The drain region 137d_1 is connected with the drain region 137c_1 of the upper third transistor T3_1, and is connected with the connection member 174 through the contact hole 63. The right fourth transistor T4_2 includes the channel region 131d_2, a source region 136d_2, a drain region 137d_2, and a gate electrode 155d_2 that overlaps the channel region 131d_2. The gate electrode 155d_2 is a part of the second scan line 152. The drain region 137d_2 is connected with the source region 136d_1 of the left fourth transistor T4_1, and the source region 136d_2 is connected with a connection member 175 through a contact hole 65.

The connection member 175 may be included in the above-described second conductive layer or the third conductive layer. When the connection member 175 is included in the third conductive layer, the connection member 175 may be electrically connected with the initialization voltage line 159 through a contact hole 64.

The fifth transistor T5 includes the channel region 131e, a source region 136e, a drain region 137e, and a gate electrode 155e that overlaps the channel region 131e. The gate electrode 155e is a part of the control line 153. The source region 136e is connected with the driving voltage line 172 through a contact hole 67, and the drain region 137e is connected with the source region 136a of the first transistor T1.

The sixth transistor T6 includes the channel region 131f, a source region 136f, a drain region 137f, and a gate electrode 155f that overlaps the channel region 131f The gate electrode 155f is a part of the control line 153. The source region 136*f* is connected with the drain region 137*a* of the first transistor T1, and the drain region 137*f* is connected with a connection member 179 through a contact hole 69. The connection member 179 may be included in the third conductive layer on a cross-section.

The seventh transistor T7 includes the channel region 131*g*, a source region 136*g*, a drain region 137*g*, and a gate electrode 155*g* that overlaps the channel region 131*g*. The gate electrode 155*g* is a part of the third scan line 154. The source region 136*g* is connected with the drain region 137*f* of the sixth transistor T6, and the drain region 137*g* is connected with the connection member 175 through the contact hole 65, and thus, receives an initialization voltage.

The capacitor Cst may include the driving gate electrode 155*a* and the expansion portion 157 of the storage line 156, which overlap each other with the second insulation layer 142 disposed between the driving gate electrode 155*a* and the expansion portion 157 of the storage line 156. In this manner, the driving gate electrode 155*a* and the expansion portion 157 of the storage line 156 function as two terminals of the capacitor Cst.

The above-described pixel electrode layer may include the pixel electrode 191 and a pixel conductive pattern 192. The pixel electrode 191 is connected with a connection member 179 through a contact hole 89 and receives a data voltage. The pixel conductive pattern 192 may be bent along an edge of the pixel electrode 191 that is adjacent to the pixel conductive pattern 192. The pixel conductive pattern 192 may transmit the initialization voltage.

A method for detecting a defect, such as a crack, in a display device according to one or more exemplary embodiments will be described with reference to FIGS. 7 to 12.

Figure 7:
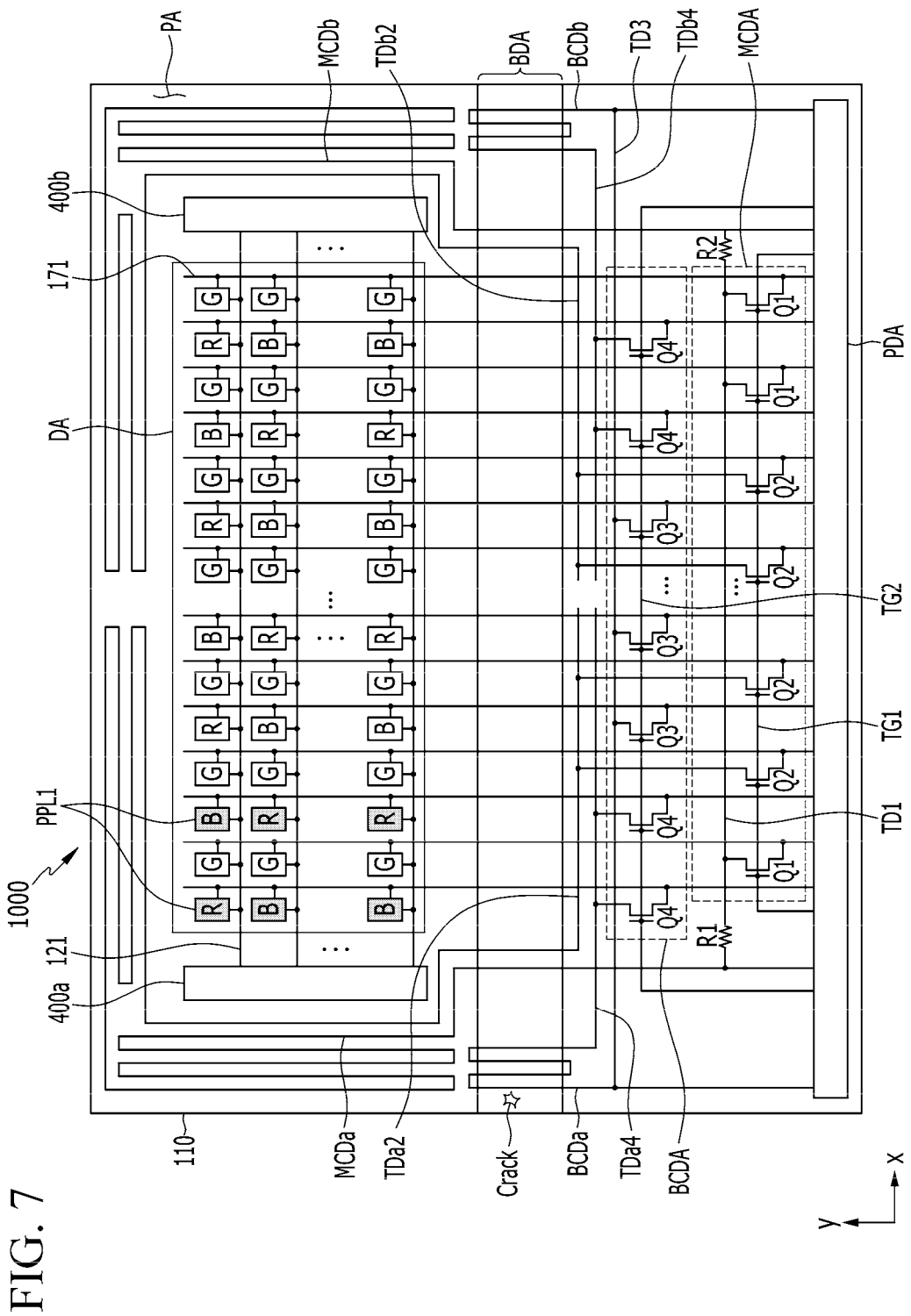
FIGS. 7 and 8 are plan views of a display panel including a crack in a bending area of a display device in a light emitting state of a pixel according to one or more exemplary embodiments.
Figure 8:
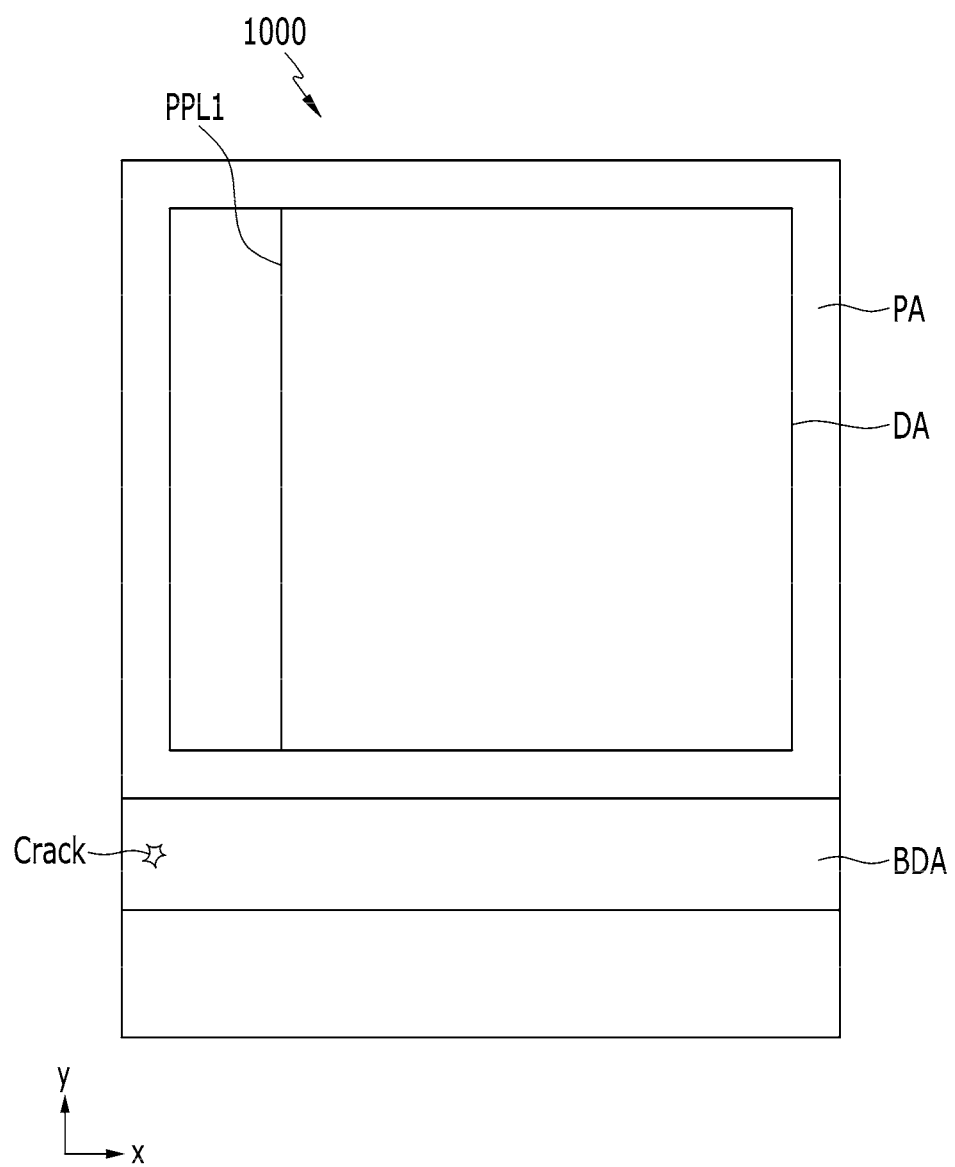
Figure 9:
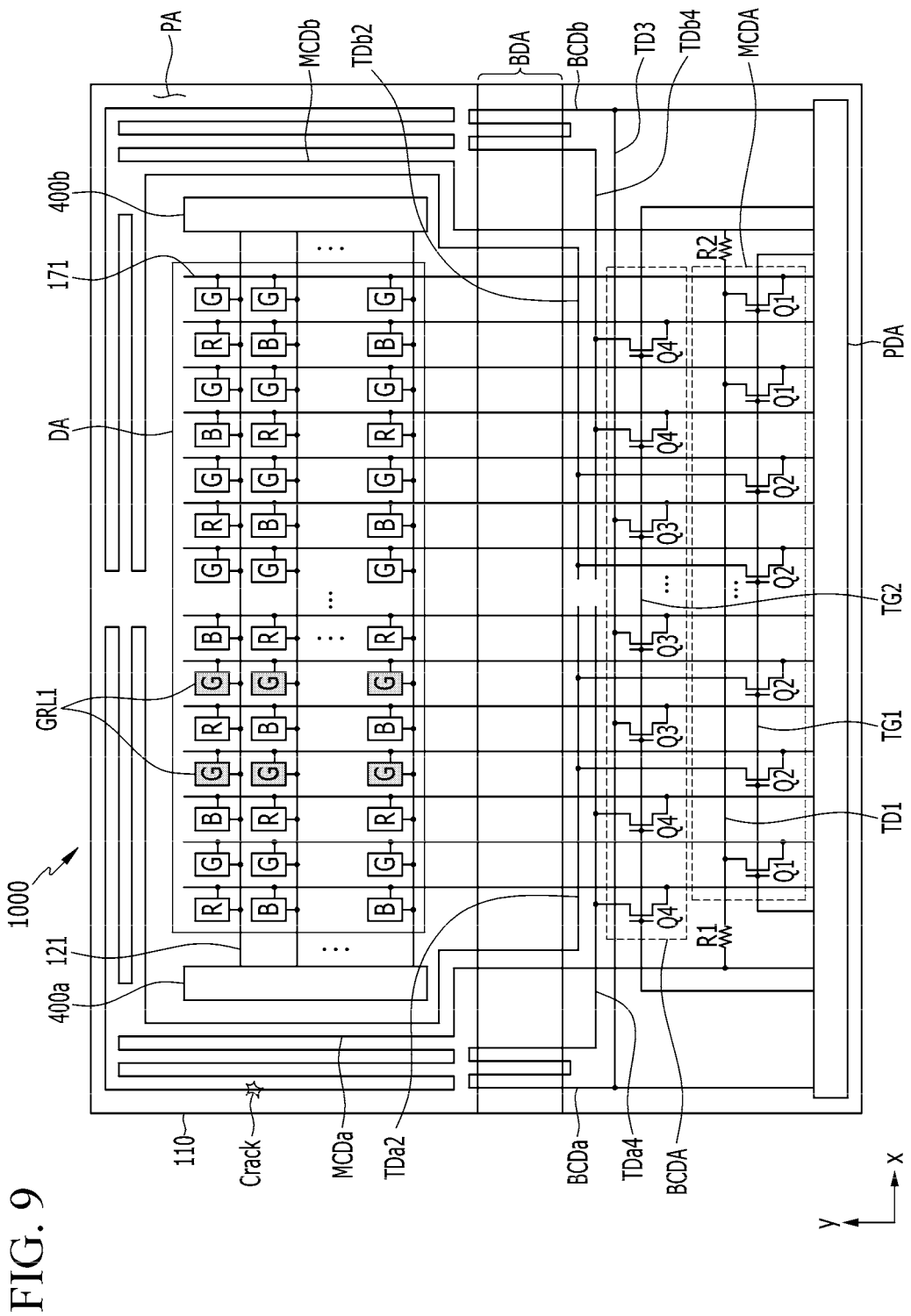
FIGS. 9 and 10 are plan views of a display panel including a crack in a peripheral area other than a bending area of a display device in a light emitting state of a pixel according to one or more exemplary embodiments.
Figure 10:
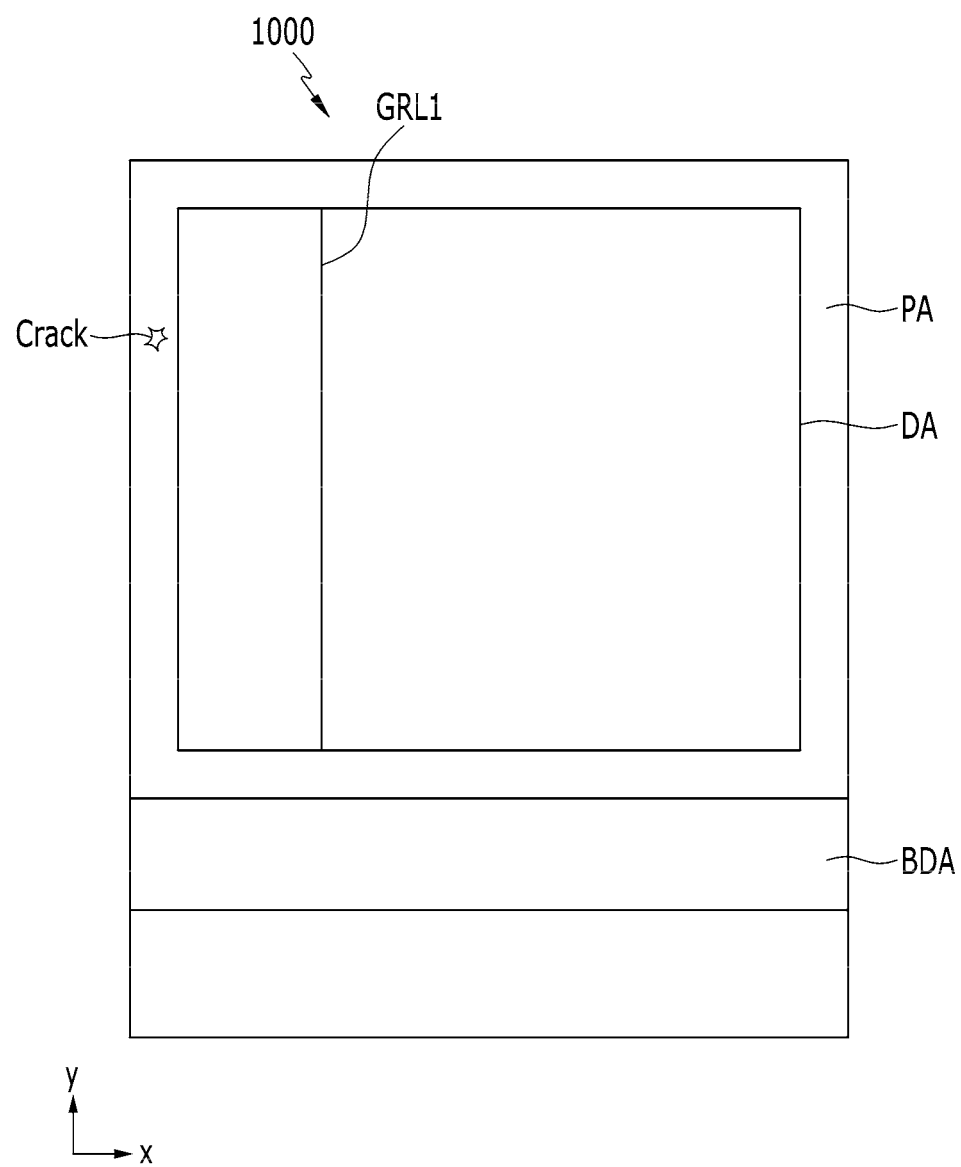
Figure 11:
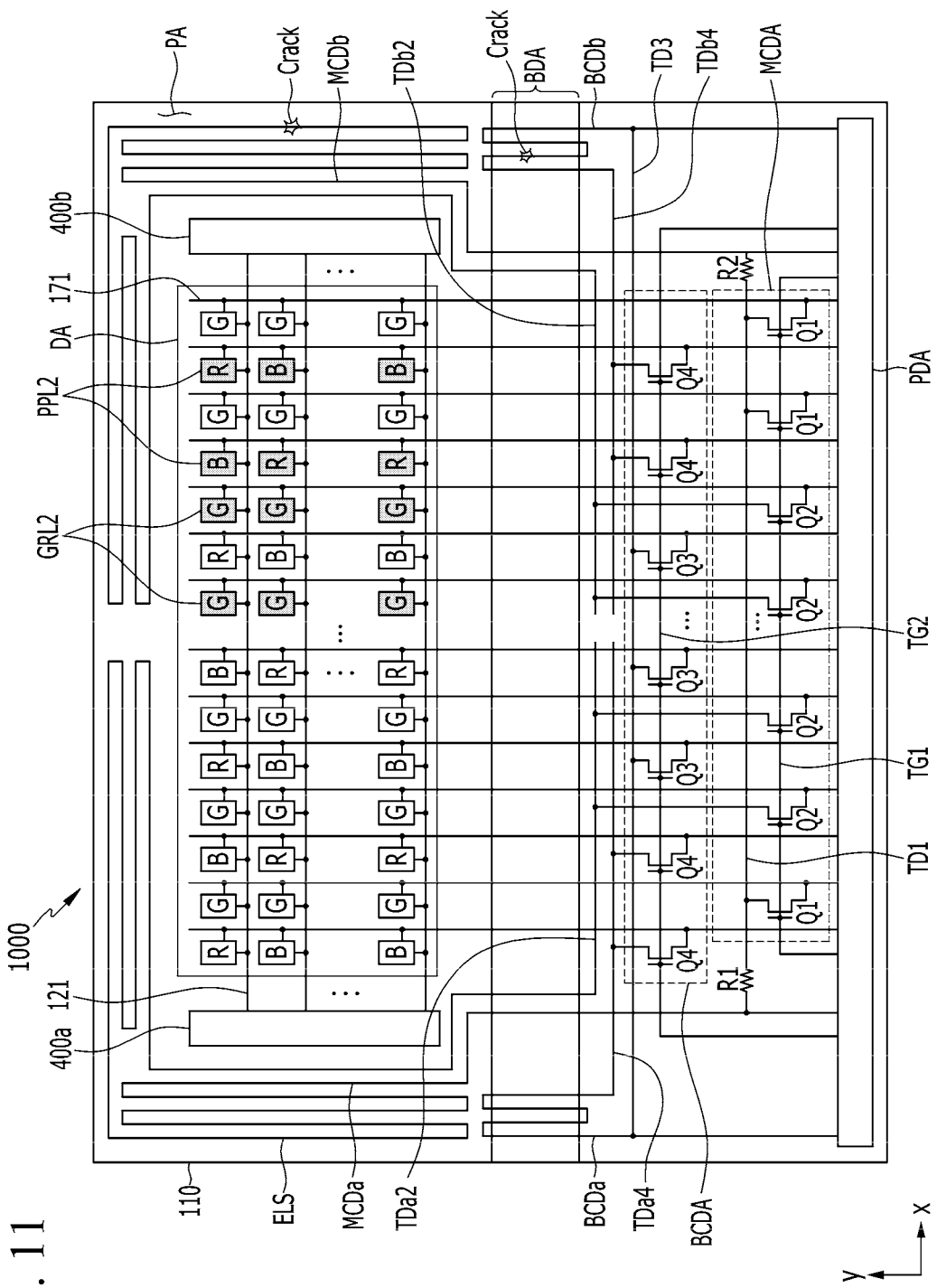
FIGS. 11 and 12 are plan views of a display panel including a crack in a bending area and a peripheral area other than a bending area of a display device in a light emitting state of a pixel according to one or more exemplary embodiments.
Figure 12:
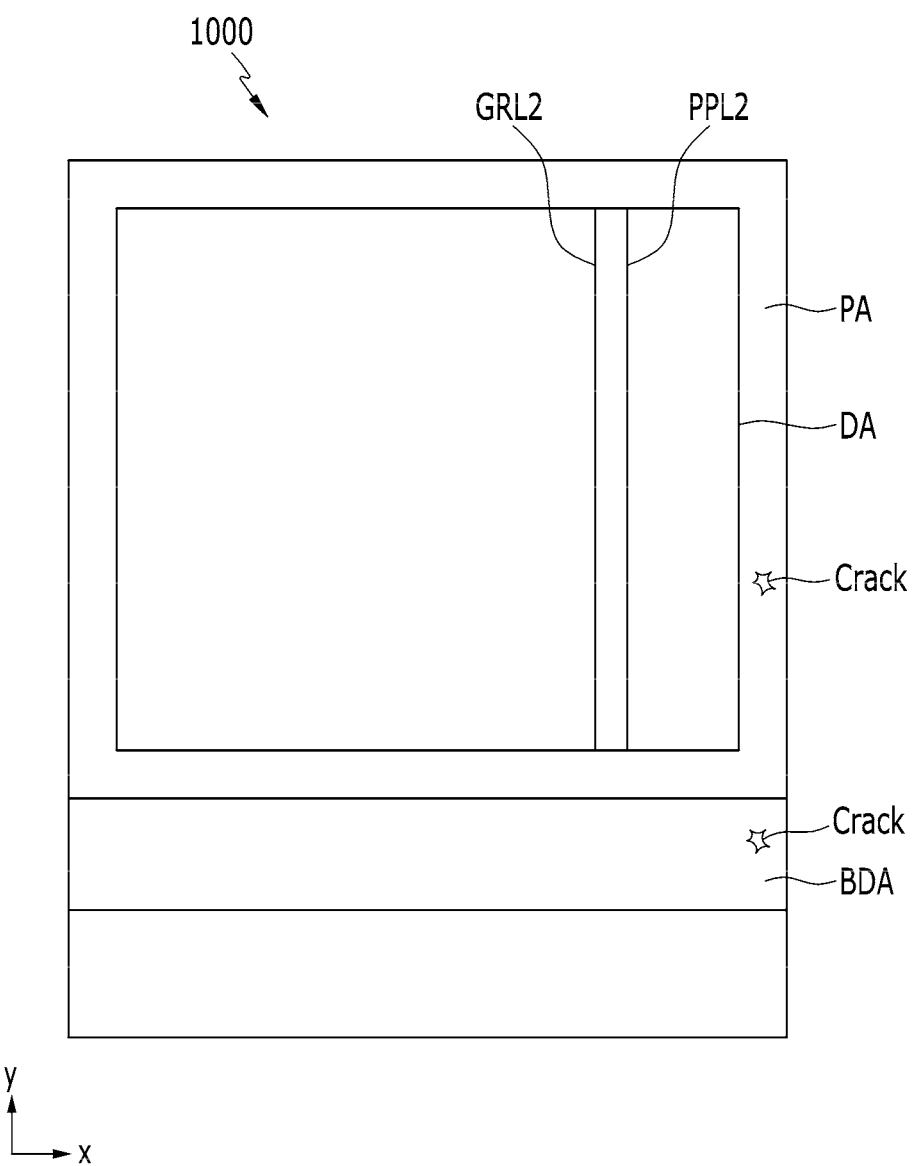

FIGS. 7 and 8 are plan views of a display panel including a crack in a bending area of a display device in a light emitting state of a pixel according to one or more exemplary embodiments. FIGS. 9 and 10 are plan views of a display panel including a crack in a peripheral area other than a bending area of a display device in a light emitting state of a pixel according to one or more exemplary embodiments. FIGS. 11 and 12 are plan views of a display panel including a crack in a bending area and a peripheral area other than a bending area of a display device in a light emitting state of a pixel according to one or more exemplary embodiments.

A test voltage is applied to the test data lines TD1 and TD3 through the pad portion PDA. The test voltage can be applied to the test data lines TD1 and TD3 without passing through main crack detection lines MCDa and MCDb and bending crack detection lines BCDa and BCDb. When a gate signal of a gate-on voltage is also applied to the test gate lines TG1 and TG2, switches Q1, Q2, Q3, and Q4 of the main crack detection circuits MCDA and the bending crack detection circuits BCDA are turned on. Then, the test voltage applied to the test data lines TD1 and TD3 is applied to a data line 171 through the turned-on switches Q1 and Q3. The test voltage is a predetermined voltage, and may be for example a voltage for pixels R, G, and B to display a lowest gray. For instance, the test voltage may be about 7 V. In this manner, the pixels R, G, and B that are connected with the turned-on switches Q1 and Q3 may display a low gray, such as a black color.

Assuming no crack or lifting occurs in the peripheral area PA and the bending area BDA of a display panel 1000, and no damage-related effects are applied to the main crack detection lines MCDa and MCDb and the bending crack detection lines BCDa and BCDb (that is, the main crack detection lines MCDa and MCDb and the bending crack detection lines BCDa and BCDb are in a normal state), a voltage applied to the test data lines TDa2 and TDb2 of a main crack detection circuit MCDA through the main crack detection lines MCDa and MCDb and a voltage applied to the test data lines TDa4 and TDb4 of a bending crack detection circuit BCDA through the bending crack detection lines BCDa and BCDb may be substantially equivalent to each other. For this, the values of the matching resistors R1 and R2 can be controlled. In this case, the pixels R, G, and B that are connected with the switches Q2 and Q4 may display a determined gray, such as a black color, like the pixels R, G, and B that are connected with the switches Q1 and Q3.

However, when a crack or lifting occurs in the peripheral area PA and/or the bending area BDA of the display panel 1000, and thus, the main crack detection lines MCDa and MCDb and/or the bending crack detection lines BCDa and BCDb are short-circuited or wire resistance is increased due to the damage, a black data voltage may not be able to be applied to the pixels R, G, and B that are connected with the switch Q2 and/or Q4 or a sufficient (or substantially equivalent) black data voltage cannot be applied thereto. Accordingly, a strongly bright line or a weak bright line may be viewed along a column of the pixels R, G, and B that are connected with the switch Q2 and/or switch Q4. The defect, such as a crack, that may occur in the peripheral area PA and/or the bending area BDA of the display panel 1000 can be detected based on observing the bright light.

For instance, when a pixel column connected with the switch Q2 of the main crack detection lines MCDa and MCDb includes only a green pixel G, a bright green light may be viewed when a defect, such as a crack, occurs in the peripheral area PA around the display area DA. When a pixel column connected with the switch Q4 of the bending crack detection lines BCDa and BCDb includes a red pixel R and a blue pixel B, a bright purple light may be viewed when a defect, such as a crack, occurs at an edge area of the bending area BDA. Thus, whether or not a defect occurs in the peripheral area PA around the display area DA or whether a defect occurs in the bending area BDA can be separately detected through a color of the bright light that is viewed in the display area DA when a failure, such as a crack, is detected.

For example, referring to FIGS. 7 and 8, when a defect, such as a crack, occurs in a left edge area of the bending area BDA, resistance of the bending crack detection line BCDa is relatively increased such that a bright purple line may be viewed along a pixel column PPL1 that connected with the switch Q4 of the bending crack detection circuit BCDA. Darkened pixels R and B in FIG. 7 may be viewed substantially brighter than peripheral (or adjacent) pixels.

Referring to FIGS. 9 and 10, when a defect, such as a crack, occurs in a left portion of the peripheral area PA of the display area DA, resistance of the main crack detection line MCDa is relatively increased such that a bright green line may be viewed along a pixel column GRL1 that is connected with the switch Q2 of the main crack detection line MCDa. The darkened pixels G in pixel column GRL1 of FIG. 9 may be viewed substantially brighter than peripheral (or adjacent) pixels.

Referring to FIGS. 11 and 12, when a defect, such as a crack, occurs in the right portion of the peripheral area PA of the display area DA and a right edge area of the bending area BDA, resistance of the main crack detection line MCDb and resistance of the bending crack detection line BCDb are relatively increased such that a bright green line may be viewed along a pixel column GRL2 that is connected to the switch Q2 of the main crack detection circuit MCDA and a bright purple light may be viewed along a pixel column PPL2 that is connected to the switch Q4 of the bending crack detection circuit BCDA. Darkened pixels R, G, and B in FIG. 11 may be viewed substantially brighter than peripheral (or adjacent) pixels.

According to one or more exemplary embodiments, defects, such as cracks, that may occur in the peripheral areas PA of the bending area BDA and the display area DA can be detected, and discharge of a defective display panel in a subsequent process can be prevented or an unrepairable defective display panel may be discharged without proceeding further in a manufacturing process. For instance, since a defect, such as a crack, may also be detected in the periphery of the bending area BDA, whether or not a defect, such as a short circuit or an increase of resistance in several signal lines that pass through the bending area BDA, occurs can be easily detected.

Testing whether or not a defect, such as a crack and the like, occurs in the peripheral area PA at the periphery of the display area DA by applying a gate-on voltage to the test gate line TG1 and testing whether or not a defect, such as a crack and the like, occurs in the bending area BDA by applying the gate-on voltage to the test gate line TG2 may be simultaneously performed, or may be performed at different times.

Figure 13:
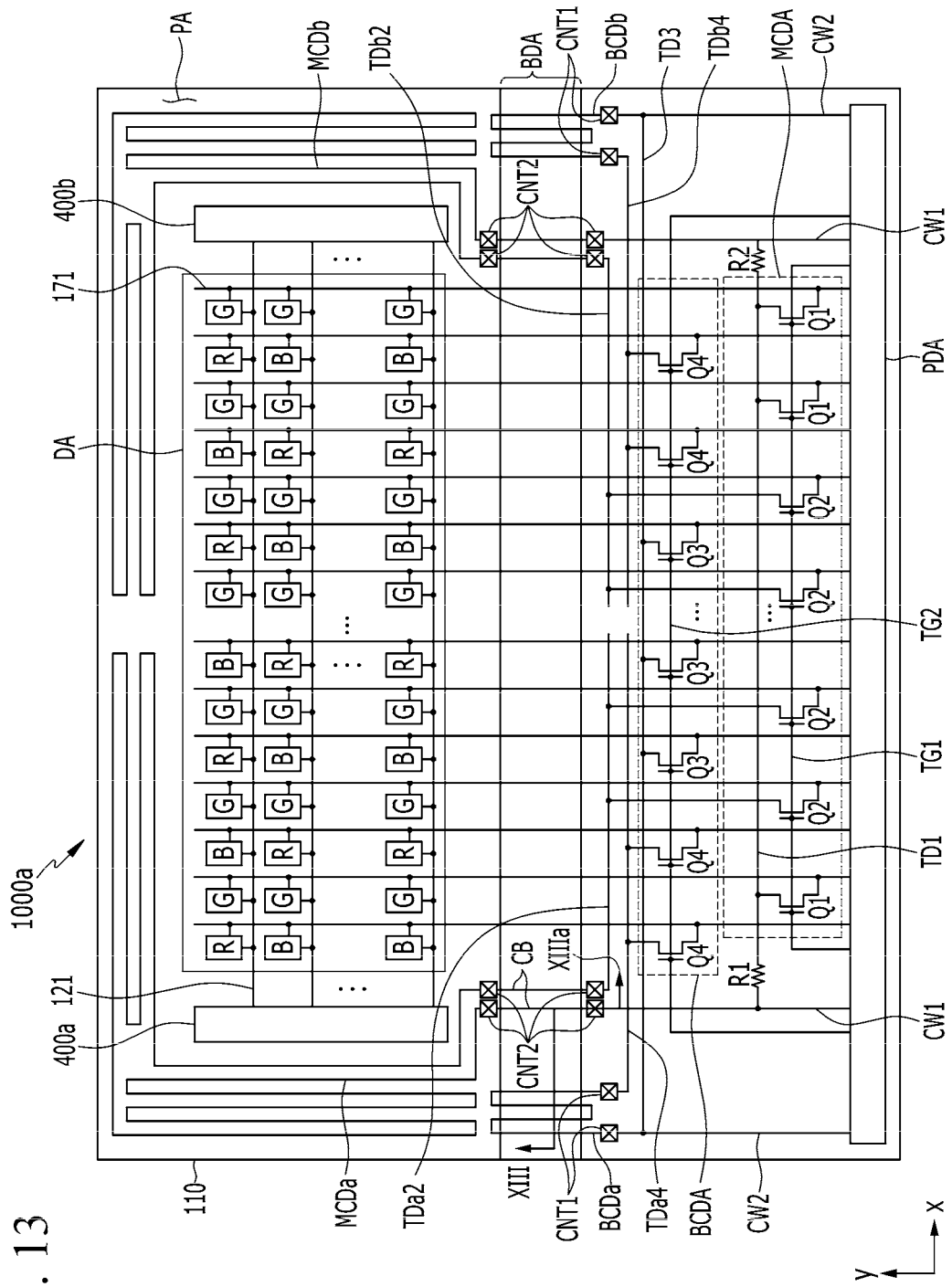
FIG. 13 is a plan view of a display device including a display panel according to one or more exemplary embodiments.
Figure 14:
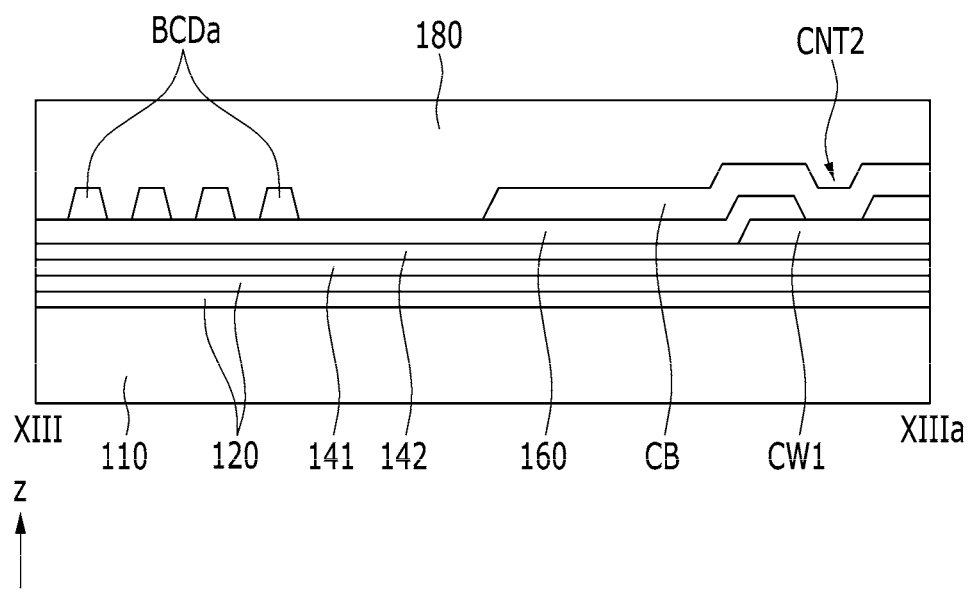
FIG. 14 is a cross-sectional view of the display device of FIG. 13 taken along sectional line XIII-XIIIa according to one or more exemplary embodiments.

FIG. 13 is a plan view of a display device including a display panel according to one or more exemplary embodiments. FIG. 14 is a cross-sectional view of the display device of FIG. 13 taken along sectional line XIII-XIIIa according to one or more exemplary embodiments. The display device of FIGS. 13 and 14 may be similar to the display device of at least FIGS. 3 and 4. As such, duplicative descriptions will be primarily omitted to avoid obscuring exemplary embodiments. As with the display device 1000 of FIG. 1, the display device 1000a of FIGS. 13 and 14 will, hereinafter, be described as a display panel 1000a.

Referring to FIGS. 13 and 14, a display panel 1000a is almost the same as the display panel 1000, except that main crack detection lines MCDa and MCDb and bending crack detection lines BCDa and BCDb may include contact portions CNT1 and CNT2 that are disposed at the periphery of the bending area BDA.

The main crack detection lines MCDa and MCDb may include bent portions (will be denoted as MCDa and MCDb for convenience of description) formed back-and-forth in left and right portions of the peripheral areas PA of a display area DA, a connection wire CB that passes through the bending area BDA, and a connection wire CW1 that is disposed below the bending area BDA and connected with a pad portion PDA.

The connection wire CB may be connected with the curved portion MCDa, the connection wire CW1, and the test data lines TDa2 and TDb2 through the contact portion CTN2 at the vertical periphery of the bending area BDA. The connection wire CB may have a mesh shape, and thus, may be highly flexible.

As shown in FIG. 14, the contact portion CNT2 may include at least one contact hole. The contact hole of the contact portion CNT2 may be provided in an insulation layer that is disposed between the curved portions MCDa and MCDb and the connection wire CB or in an insulation layer that is disposed between the connection wire CW1 and the test data lines TDa2 and TDb2. For example, the connection wire CB may be disposed in the above-described third conductive layer, and the curved portions MCDa and MCDb, the connection wire CW1, and the test data lines TDa2 and TDb2 may be disposed in the above-described second conductive layer or the above-described first conductive layer.

The bending crack detection lines BCDa and BCDb may include bent portions (will be denoted as BCDa and BCDb for convenience of description) formed back-and-forth in the bending area BDA, and a connection wire CW2 that is disposed below the bending area BDA and connected with the pad portion PDA.

The curved portions BCDa and BCDb may be connected with the connection wire CW2 and test data lines TDa4 and TDb4 through the contact portion CNT1 at the periphery of the bottom of the bending area BDA. The contact portion CNT1 may include at least one contact hole. The contact hole of the contact portion CNT1 may be provided in an insulation layer that is disposed between the curved portions BCDa and BCDb and the connection wire CW2 or an insulation layer that is disposed between the curved portions BCDa and BCDb and the test data line TD3. For example, the curved portions BCDa and BCDb may be provided in the above-described third conductive layer, and the connection wire CW2 and the test data lines TDa4 and TDb4 may be provided in the above-described second conductive layer or the above-described first conductive layer.

Figure 15:
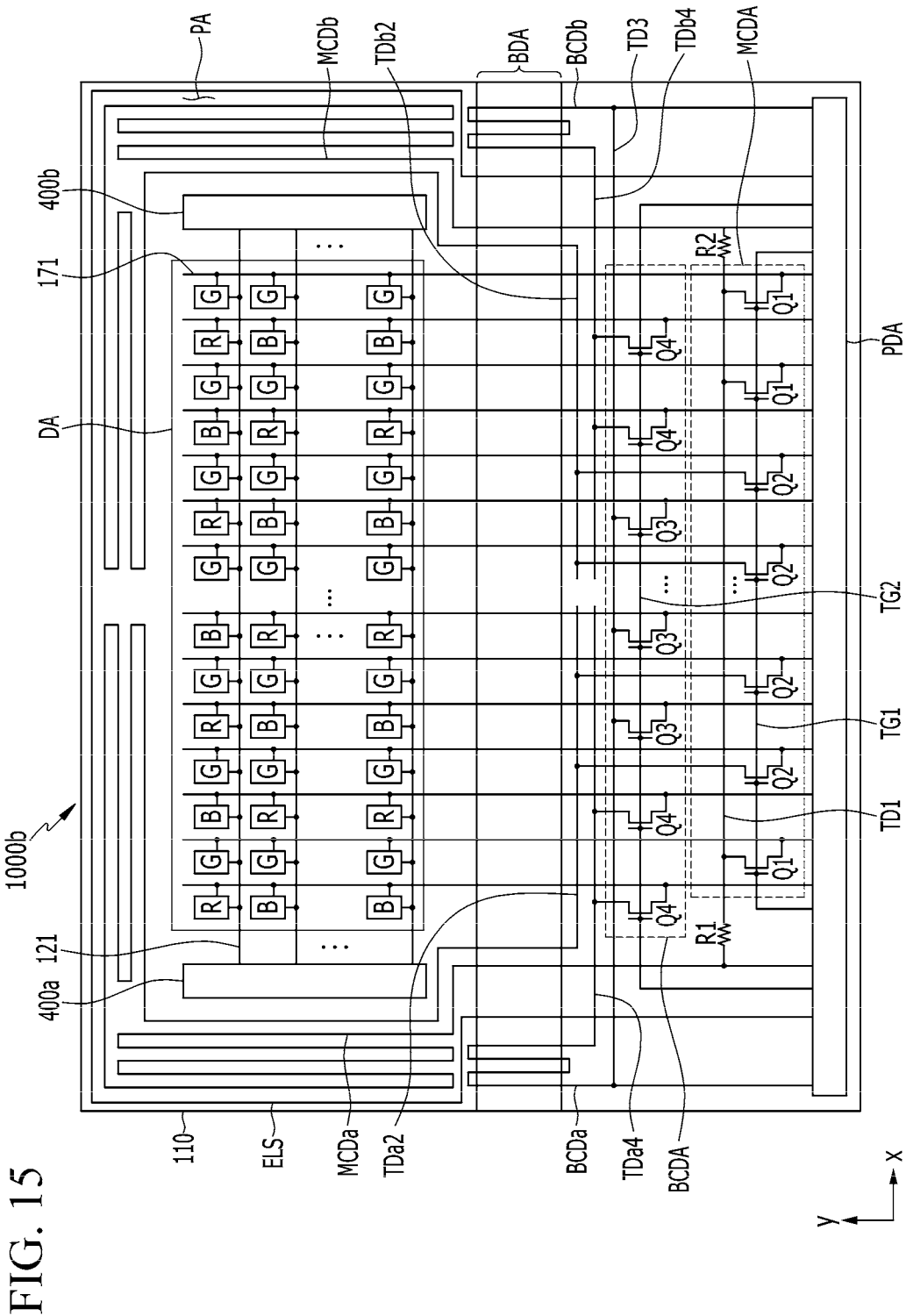
FIG. 15 is a plan view of a display device including a display panel according to one or more exemplary embodiments.
Figure 16:
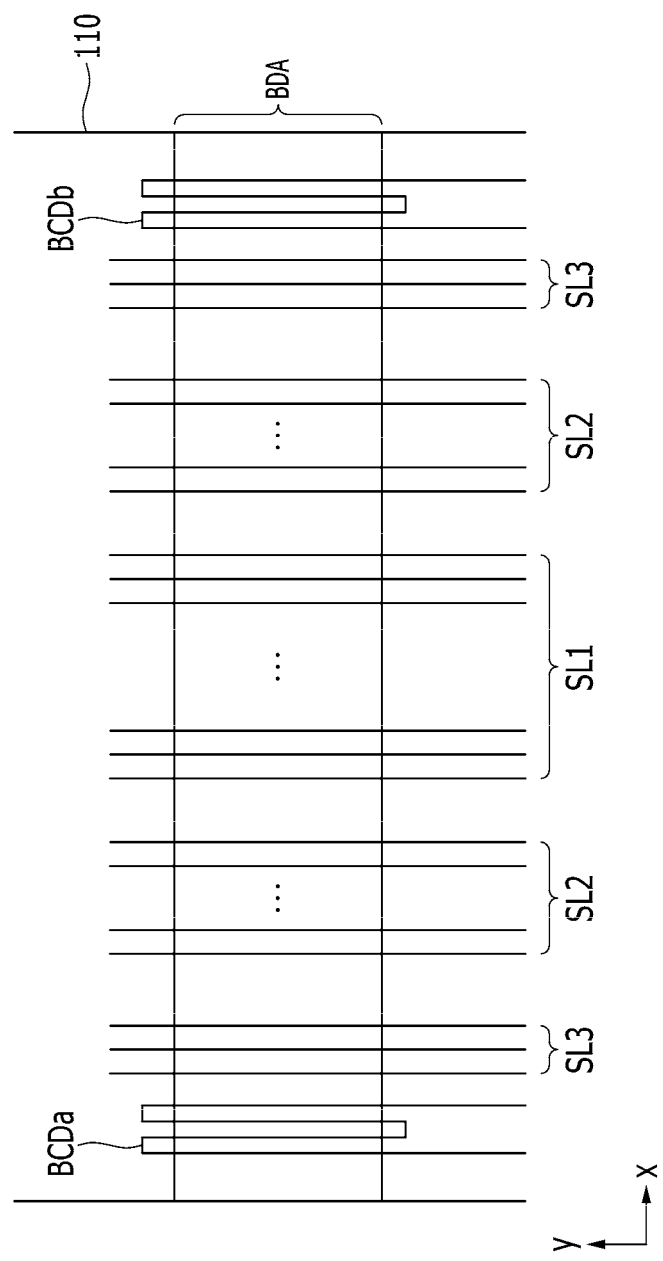
FIG. 16 is an enlarged view of a bending area of the display device of FIG. 15 according to one or more exemplary embodiments.

FIG. 15 is a plan view of a display device including a display panel according to one or more exemplary embodiments. FIG. 16 is an enlarged view of a bending area of the display device of FIG. 15 according to one or more exemplary embodiments. The display device of FIGS. 15 and 16 may be similar to the display device of at least FIGS. 3 and 4. As such, duplicative descriptions will be primarily omitted to avoid obscuring exemplary embodiments. As with the display device 1000 of FIG. 1, the display device 1000b of FIGS. 15 and 16 will, hereinafter, be described as a display panel 1000b.

Referring to FIGS. 15 and 16, a display panel 1000b is almost the same as the display panel 1000a, except that the display panel 1000b includes a plurality of signal lines that pass through the bending area BDA.

Referring to FIG. 16, the plurality of signal lines that pass through the bending area BDA may include a first signal line group SL1, a second signal line group SL2, and a third signal line group SL3, and each of the signal line groups SL1, SL2, and SL3 may include at least one signal line. For example, the first signal line group SL1 may include data lines 171, the second signal line group SL2 may include a signal line that transmits various clock signals, a signal line the transmits various frame signals, and main crack detection lines MCDa and MCDb, and the third signal line group SL3 may include a common voltage transmission line ELS that transmits a common voltage ELVSS, a signal line that transmits a gate low voltage, and a signal line that transmits an initialization voltage.

According to one or more exemplary embodiments, the bending crack detection lines BCDa and BCDb may be disposed between the third signal line group SL3 and an edge of the substrate 110. In this case, as shown in FIG. 15, the bending crack detection lines BCDa and BCDb may be disposed between the common voltage transmission line ESL included in the third signal line group SL3 in the bending area BDA and the edge of the substrate 110. The common voltage transmission line ELS may extend along the outer periphery of the display area DA after passing through the bending area BDA from the pad portion PDA. Opposite ends of the common voltage transmission line ELS are connected to the pad portions PDA at the left and right sides of the display panel 1000*b* and receive the common voltage ELVSS, and may extend along the periphery of the display area DA.

Figure 17:
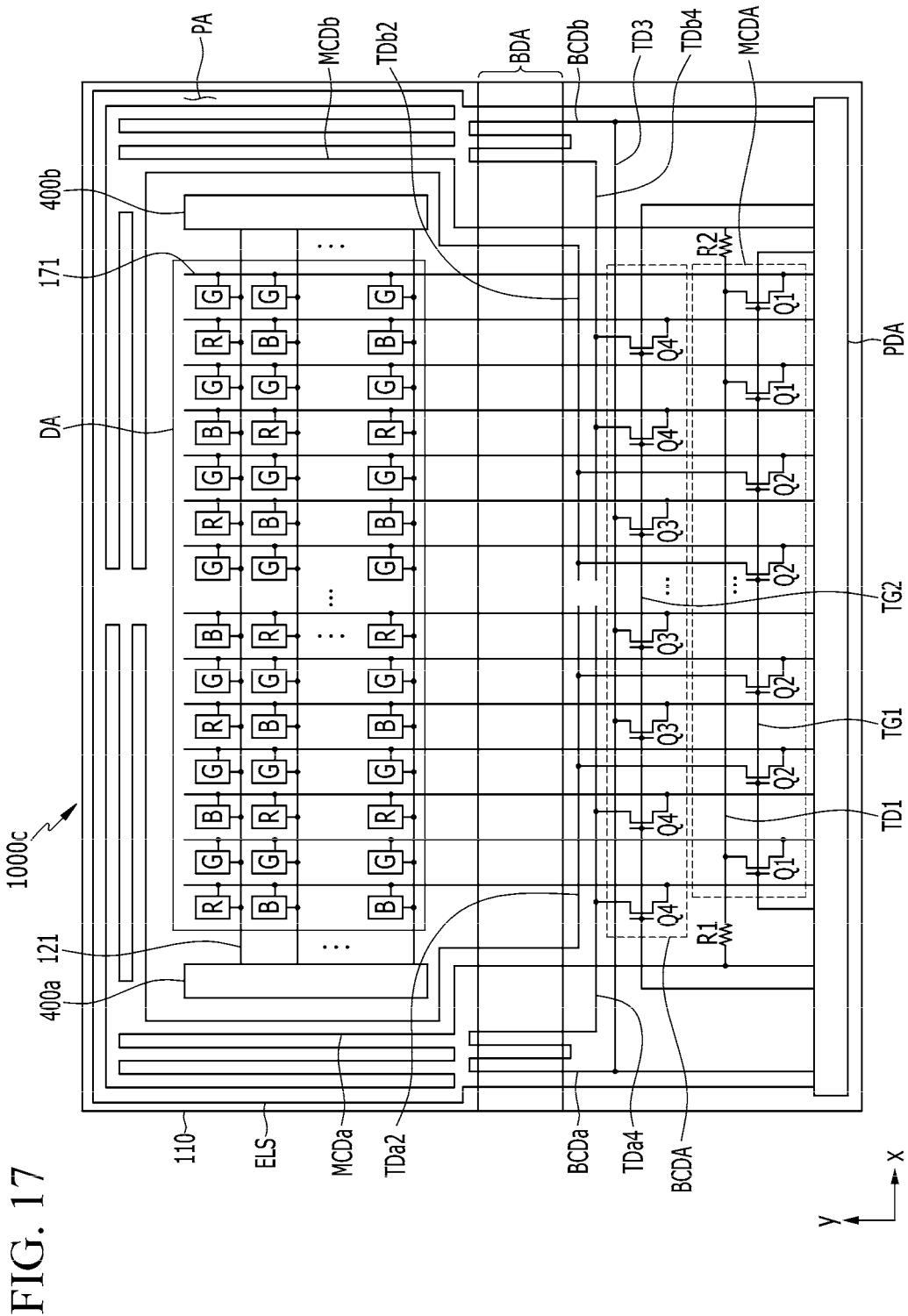
FIG. 17 is a plan view of a display device including a display panel according to one or more exemplary embodiments.
Figure 18:
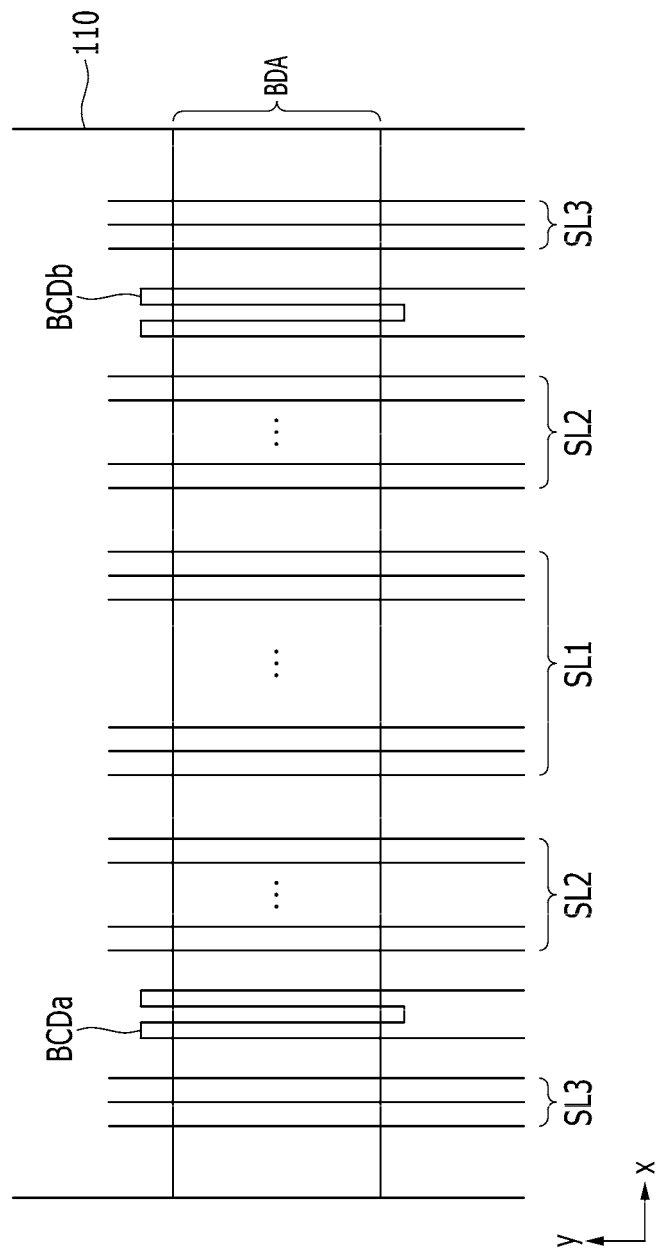
FIG. 18 is an enlarged view of a bending area of the display device of FIG. 17 according to one or more exemplary embodiments.

FIG. 17 is a plan view of a display device including a display panel according to one or more exemplary embodiments. FIG. 18 is an enlarged view of a bending area of the display device of FIG. 17 according to one or more exemplary embodiments. The display device of FIGS. 17 and 18 may be similar to the display device of at least FIGS. 15 and 16. As such, duplicative descriptions will be primarily omitted to avoid obscuring exemplary embodiments. As with the display device 1000 of FIG. 1, the display device 1000*c* of FIGS. 17 and 18 will, hereinafter, be described as a display panel 1000*c*.

Referring to FIGS. 17 and 18, a display panel 1000*c* is almost the same as the display panel 1000*b* of FIGS. 15 and 16, except that bending crack detection lines BCDa and BCDb are disposed between the third signal line group SL3 and the second signal line group SL2 in the bending area BDA. In this case, as shown in FIG. 17, a common voltage transmission line ELS included in the third signal group line SL3 in the bending area may be disposed between an edge of a substrate 110 and the bending crack detection lines BCDa and BCDb.

FIGS. 19, 20, 21, and 22 are plan views of display devices including display panels according to various exemplary embodiments. The display devices of FIGS. 19 to 22 may be similar to the display devices of at least FIGS. 3, 13, 15, and 17. As such, duplicative descriptions will be primarily omitted to avoid obscuring exemplary embodiments. As with the display device 1000 of FIG. 1, the display devices of FIGS. 19 to 22 will, hereinafter, be described as display panels.

Figure 19:
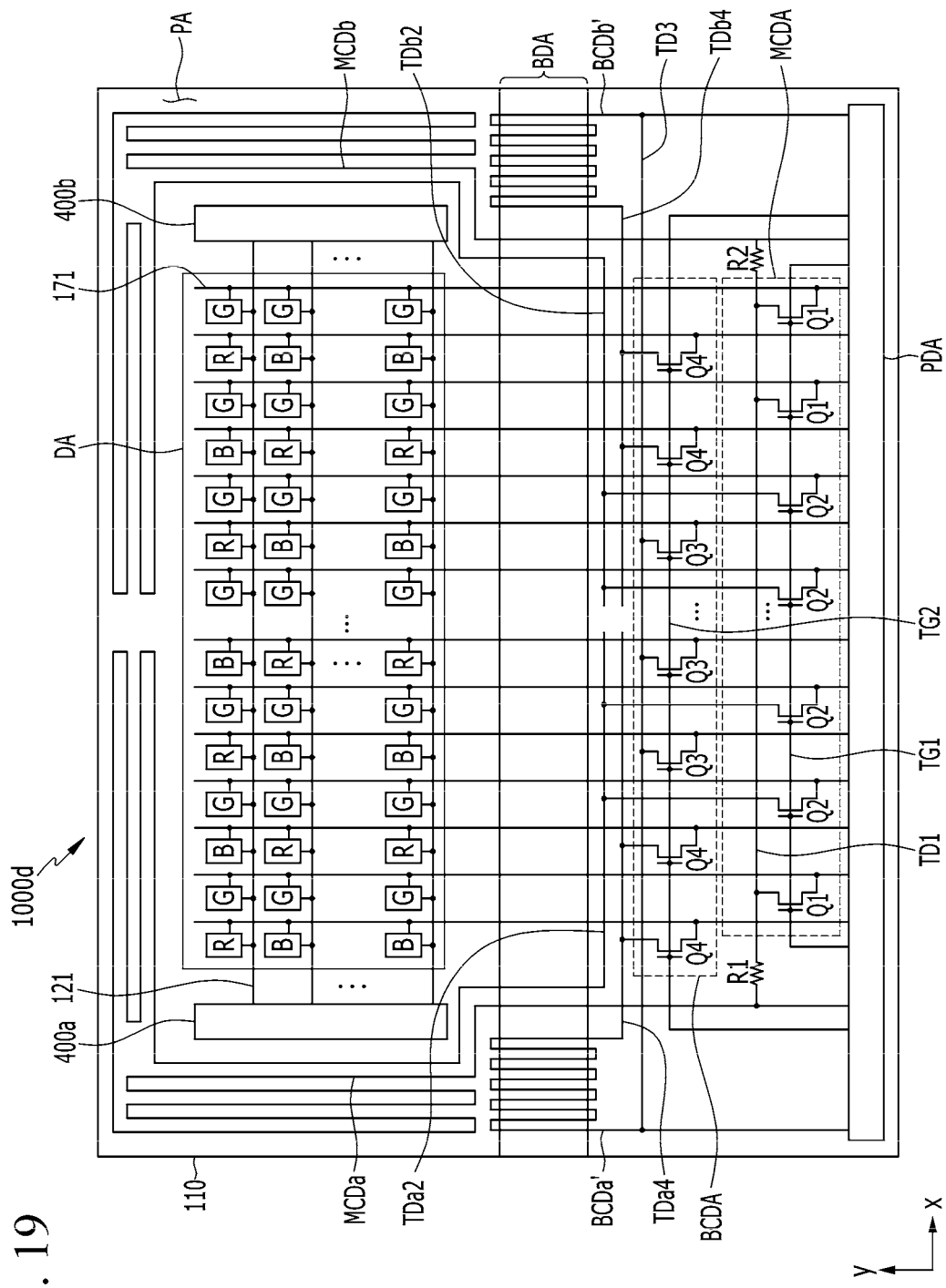

First, referring to FIG. 19, a display panel 1000*d* is almost the same as the display panel 1000, except that a length of bending crack detection lines BCDa' and BCDb' that are provided in a bending area BDA is increased in the display panel 1000*d*, thereby causing an increase in wire resistance. For instance, the bending crack detection lines BCDa' and BCDb' may include additional back-and-forth portions. In addition to or apart from this, the wire resistance may be increased by reducing a line width of the bending crack detection lines BCDa' and BCDb' that are provided in the bending area BDA. As described, a resistance change amount can be increased by increasing resistance of the bending crack detection lines BCDa' and BCDb' in the bending area BDA, and accordingly, sensitivity for detection of a defect, such as a crack, in the bending area BDA can be enhanced.

Alternatively, the wire resistance can be controlled according to conditions by increasing or decreasing the length and/or the line width of the bending crack detection lines BCDa' and BCDb' in the bending area BDA.

Figure 20:
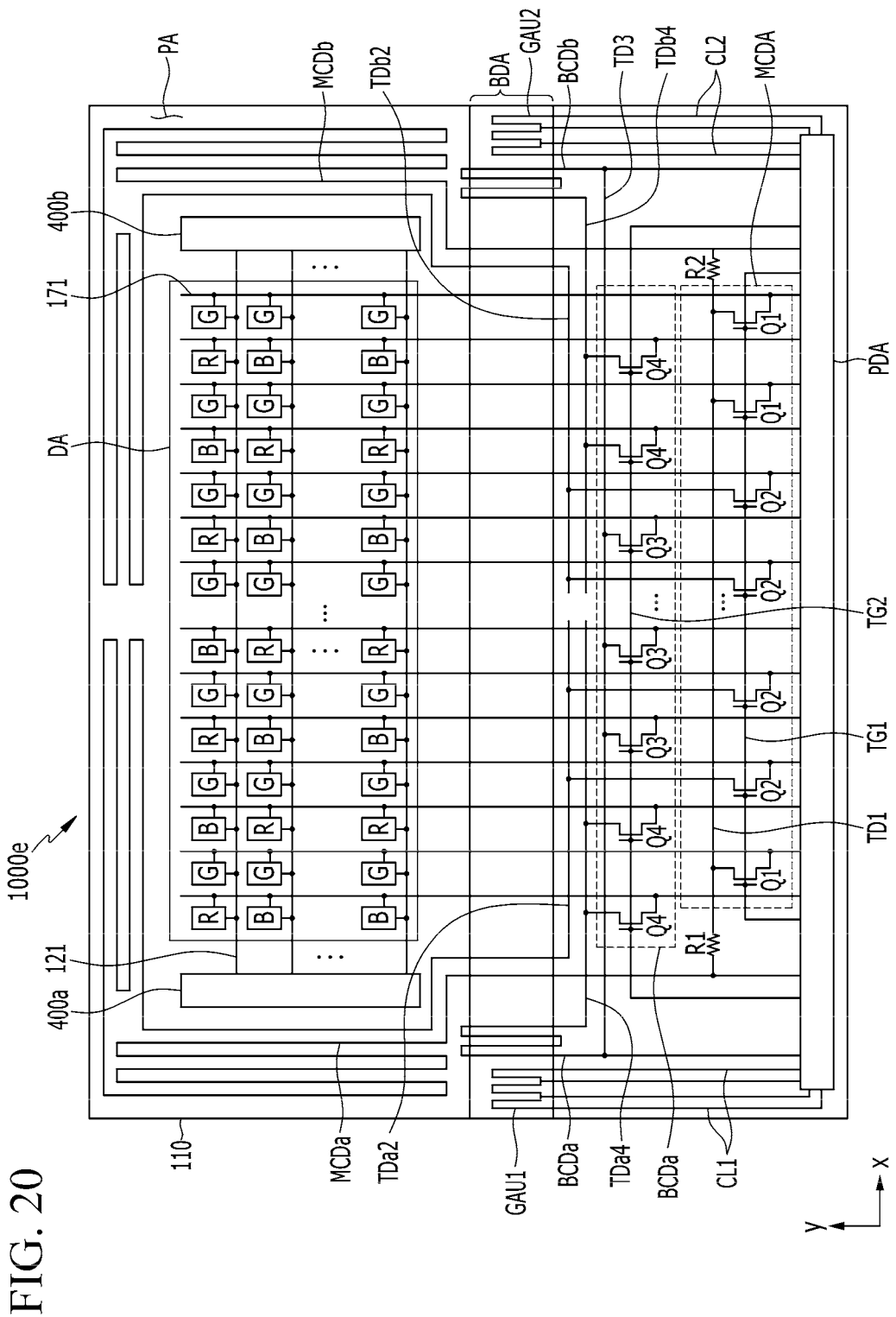

Next, referring to FIG. 20, a display panel 1000*e* is almost the same as the display panel 1000, except that the display panel 1000*e* further includes strain gauges GAU1 and GAU2 that include a resistor line that is provided in a bending area BDA. The resistor line of the strain gauges GAU1 and GAU2 may be disposed in the left and/or right edge regions of the bending area BDA. Resistance of the resistor line of the strain gauges GAU1 and GAU2 may vary depending on a degree of bending of the bending area BDA, and stress applied to the bending area BDA can be detected by sensing such a resistance change. The resistor line of the strain gauges GAU1 and GAU2 may include a bent portion formed in a back-and-forth pattern in the bending area BDA, and may be connected to a pad portion PDA through a plurality of connection wires CL1 and CL2. The connection wires CL1 and CL2 may be respectively connected to other portions of the resistor line of the strain gauges GAU1 and GAU2.

The resistor line of the strain gauges GAU1 and GAU2 may be provided on the same layer as one of the above-described first, second, and third conductive layers.

Figure 21:
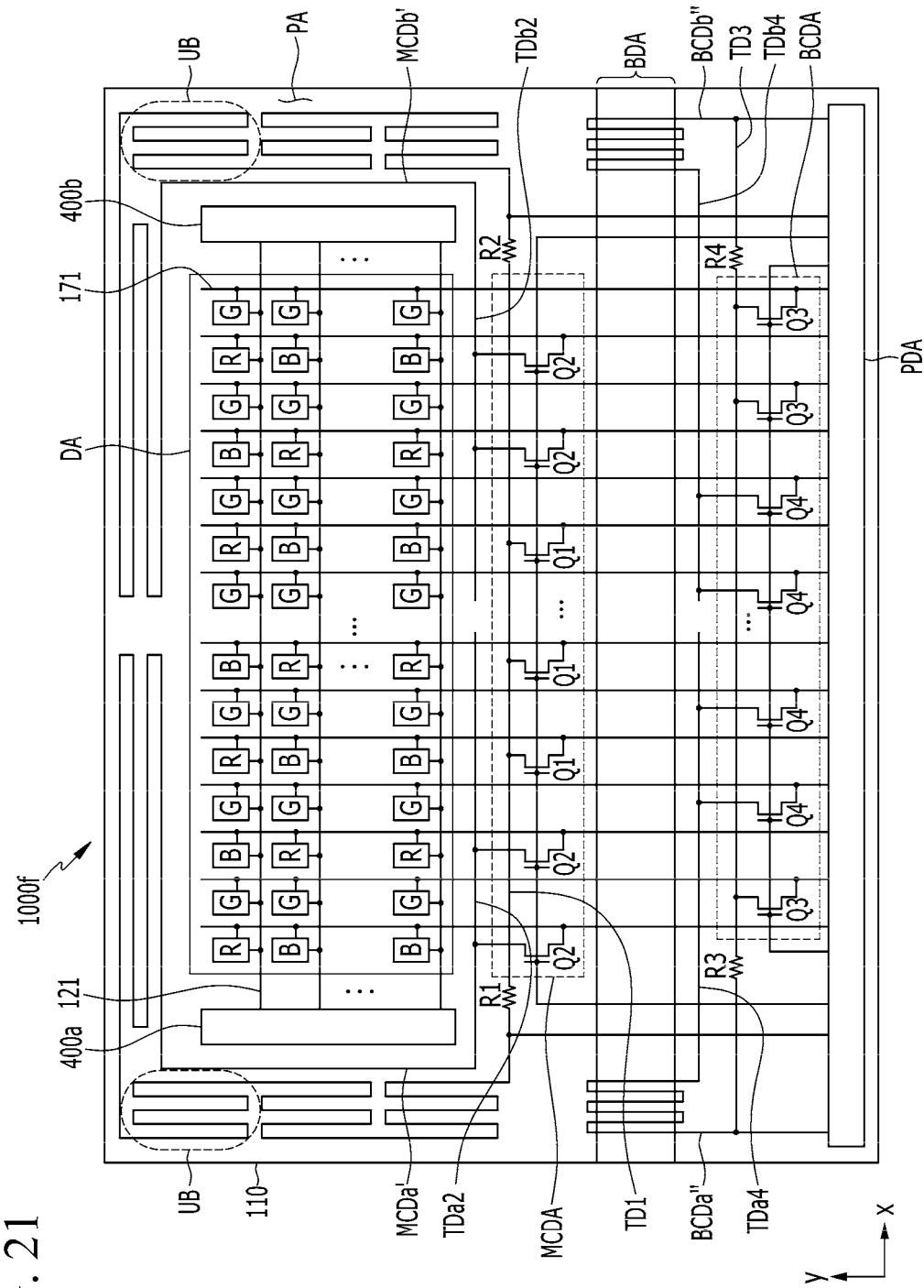

Next, referring to FIG. 21, a display device 1000*f* is almost the same as the display device 1000, except that at least one of a main crack detection circuit MCDA and a bending crack detection circuit BCDA is disposed between a bending area BDA and a display area DA. In FIG. 21, the main crack detection circuit MCDA is disposed between the bending area BDA and the display area DA, and the bending crack detection circuit BCDA is disposed between the bending area BDA and a pad portion PDA.

In addition, matching resistors R3 and R4 may be respectively connected to opposite ends of the pad portion PDA and the bending crack detection circuit BCDA. The matching resistors R3 and R4 may have resistance that is equal (or similar) to the entire wire resistance of the bending crack detection lines BCDa" and BCDb". However, exemplary embodiments are not limited thereto or thereby, and resistance values of the matching resistors R3 and R4 such that crack detection sensitivity and the like may be appropriately set.

In addition, curved portions of the main crack detection lines MCDa' and MCDb', disposed in left and right portions of the peripheral area PA of the display area DA, may increase wire resistance by including several blocks UB. Main crack detection lines MCDa' and MCDb' of each block UB may be formed in back-and-forth portions in the y-axis direction.

Also, a length of bending crack detection lines BCDa" and BCDb" that are provided in a bending area BDA may be increased in the display panel 1000*f*, thereby causing an increase in wire resistance. For instance, the bending crack detection lines BCDa" and BCDb" may include additional back-and-forth portions. In addition to or apart from this, the wire resistance may be increased by reducing a line width of the bending crack detection lines BCDa" and BCDb" that are provided in the bending area BDA. As described, a resistance change amount can be increased by increasing resistance of the bending crack detection lines BCDa" and BCDb" in the bending area BDA, and accordingly, sensitivity for detection of a defect, such as a crack, in the bending area BDA can be enhanced.

Alternatively, the wire resistance can be controlled according to conditions by increasing or decreasing the length and/or the line width of the bending crack detection lines BCDa" and BCDb" in the bending area BDA.

Figure 22:
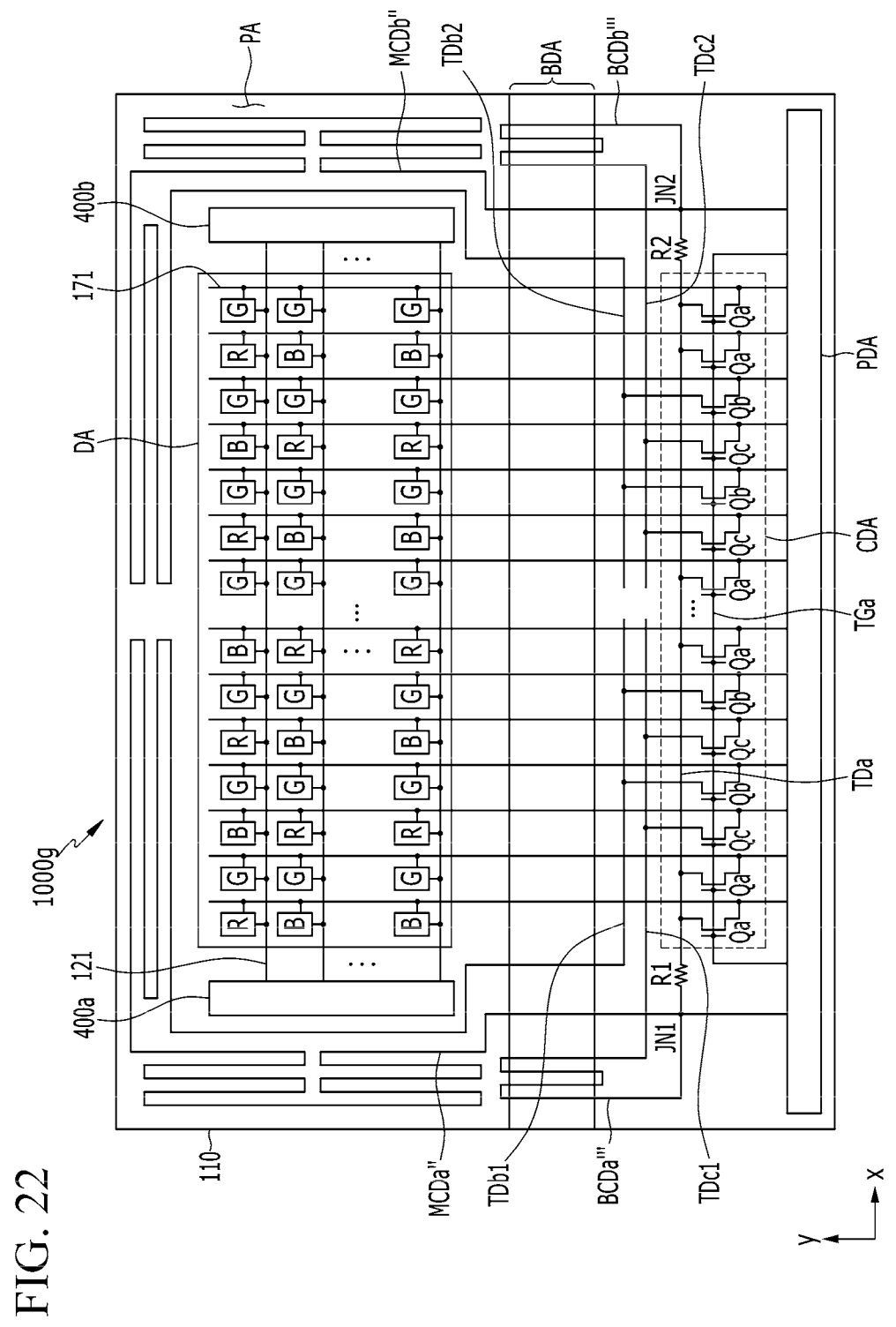

Referring to FIG. 22, a display panel 1000*g* is almost the same as the display panel 1000, except that one crack detection circuit CDA is included instead of including a main crack detection circuit MCDA and a bending crack detection circuit BCDA that are separate from each other. The crack detection circuit CDA may be disposed between a bending area BDA and a pad portion PDA.

One end of each of the main crack detection lines MCDa" and MCDb" is respectively connected with the pad portion PDA through nodes JN1 and JN2, and the other end of each of the main crack detection lines MCDa" and MCDb" may be connected with a test data line TDb that substantially extends in the x-axis direction between the bending area BDA and the crack detection circuit CDA. A first end of the test data line TDb1, connected with the main crack detection line MCDa', and a first end of the test data line TDb2, connected with the main crack detection line MCDb, may be disposed facing each other, but they may be separated from each other.

A first end of each of the bending crack detection lines BCDa''' and BCDb''' is connected with the pad portion PDA through the nodes JN1 and JN2, respectively, and a second end of each of the bending crack detection lines BCDa''' and BCDb''' are connected with a test data line TDc that substantially extends in the x-axis direction between the bending area BDA and the crack detection circuit CDA. A first end of the test data line TDc, connected with the bending crack detection line BCDa''', and a second end of the test data line TDc, connected with the bending crack detection line BCDb''', are disposed facing each other, but they may be separated from each other.

The crack detection circuit CDA may include a plurality of switches Qa, Qb, and Qc, and a test data line TDa. The plurality of switches Qa, Qb, and Qc may be substantially arranged in one row in the x-axis direction, and the plurality of switches Qa, Qb, and Qc may be disposed respectively corresponding to a plurality of data lines 171. The test data line TDa may substantially extend in the x-axis direction.

Gate terminals of the switches Qa, Qb, and Qc are connected with the test gate line TGa, and output terminals thereof are connected with the corresponding data lines 171. A pixel connected with a data line 171 to which the switches Qb and Qc are connected may represent a part of specific colors. For example, a pixel column connected with the data line 171 to which the switch Qb is connected may all be green pixels G, and a pixel column connected with the data line 171 to which the switch Qc is connected may be a pixel column where red pixels R and blue pixels B are alternately arranged. However, exemplary embodiments are not limited thereto or thereby.

An input terminal of the switch Qa is connected with the test data line TDa, an input terminal of the switch Qb is connected with the test data line TDb1 or TDb2, and an input terminal of the switch Qc is connected with the test data line TDc1 or TDc2.

The switches Qb and Qc may be disposed in a part of the crack detection circuit CDa, for example, a part of a left region and a part of a right region of the display panel 1000g, and the switch Qa may be disposed in the rest of the region of the display panel 1000g. The switch Qb and the switch Qc may be alternately arranged adjacent to each other in the regions where the switches Qb and Qc are disposed, but exemplary embodiments are not limited thereto or thereby.

Matching resistors R1 and R2 may be connected between the nodes JN1 and JN2 and the test data line TDa.

According to the one or more exemplary embodiments, a circuit for detection of a defect, such as a crack, in the peripheral area PA of the display area DA and a circuit for detection of a defect, such as a crack, in the bending area BDA are shared, such that the defects can be detected with the same sensitivity, and an area for the crack detection circuit can be minimized or at least reduced.

The display devices according to various exemplary embodiments may be any suitable display device, such as a liquid crystal display (LCD) device, an organic/inorganic light emitting display device, and the like.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device comprising:
a substrate comprising:
a display area comprising pixels and data lines; and
a peripheral area disposed outside the display area;
a pad portion disposed in the peripheral area;
a bending area disposed in the peripheral area, the bending area being bendable or in a bent state;
a first crack detection circuit disposed between the display area and the pad portion, the first crack detection circuit comprising switches;
a first crack detection line comprising a first curved portion disposed in the bending area and adjacent to a first edge of the substrate extending in a first direction, the first crack detection line being connected between the pad portion and the first crack detection circuit, the first crack detection line being configured to detect a crack generated in the bending area;
a first test data line extending in a second direction crossing the first direction in a region of the peripheral area between the display area and some of the switches such that the first test data line crosses some of the data lines in an insulated manner; and
a second test data line extending in the second direction in a region of the peripheral area between the display area and the some of the switches such that the second test data line crosses some of the data lines in an insulated manner, the second test data line being spaced apart from the first test data line in the first direction,
wherein:
the second test data line is connected to the pad portion through a first end of the first crack detection line;
the first test data line is connected to a second end of the first crack detection line different from the first end of the first crack detection line;
the second end is spaced apart from the first end in the second direction; and
the first end is closer to the first edge of the substrate than the second end in the second direction.

2. The display device of claim 1, wherein the second test data line crosses more of the data lines in an insulated manner than the first test data line.

3. The display device of claim 1, further comprising:
wherein the first crack detection circuit comprises a first switch and a second switch,
wherein the first switch comprises:
an input terminal connected with the second test data line; and
an output terminal connected with a first data line among the data lines, and
wherein the second switch comprises:
an input terminal connected with the first test data line; and
an output terminal connected with a second data line among the data lines.

4. The display device of claim 3, wherein the second data line is connected with a first pixel among the pixels, the first pixel being configured to display a first color.

5. The display device of claim 3, wherein the first crack detection circuit is disposed between the bending area and the pad portion.

6. The display device of claim 3, further comprising:
a common voltage transmission line passing through the bending area, the common voltage transmission line being configured to transmit a common voltage, wherein the first crack detection line is disposed between the common voltage transmission line and an outer edge of the peripheral area in the bending area.

7. The display device of claim 3, further comprising:
a common voltage transmission line passing through the bending area, the common voltage transmission line being configured to transmit a common voltage,
wherein the common voltage transmission line is disposed between the first crack detection line and an outer edge of the peripheral area in the bending area.

8. The display device of claim 3, further comprising:
a second crack detection line comprising a second curved portion disposed in the peripheral area at a peripheral portion of the display area, the second crack detection line being connected between the pad portion and the first crack detection circuit; and
a third test data line extending in the second direction in the peripheral area,
wherein a first end of the second crack detection line is connected with the pad portion, and a second end of the second crack detection line is connected with the third test data line.

9. The display device of claim 8, wherein:
the first crack detection circuit further comprises a third switch; and
the third switch comprises:
an input terminal connected with the third test data line; and
an output terminal connected with a third data line among the data lines.

10. The display device of claim 9, wherein the third data line is connected with a second pixel among the pixels, the second pixel being configured to display a second color.

11. The display device of claim 9, wherein the second data line is connected with:
a first pixel among the pixels, the first pixel being configured to display a first color; and
a second pixel among the pixels, the second pixel being configured to display a different color than the first color.

12. The display device of claim 3, further comprising:
a second crack detection circuit disposed between the display area and the pad portion, the second crack detection circuit comprising switches; and
a second crack detection line comprising a second curved portion disposed in the peripheral area at a peripheral portion of the display area, the second crack detection line being connected between the pad portion and the second crack detection circuit.

13. The display device of claim 12, further comprising:
a fourth test data line extending in the second direction in the peripheral area,
wherein a first end of the second crack detection line is connected with the pad portion, and a second end of the second crack detection line is connected with the fourth test data line.

14. The display device of claim 13, further comprising:
a fifth test data line extending in the second direction in the peripheral area, the fifth test data line being connected with the pad portion,
wherein the second crack detection circuit comprises a fourth switch and a fifth switch,
wherein the fourth switch comprises:
an input terminal connected with the fifth test data line; and
an output terminal connected with a fourth data line among the data lines, and wherein the fifth switch comprises:
an input terminal connected with the fourth test data line; and
an output terminal connected with a fifth data line among the data lines.

15. The display device of claim 14, further comprising:
a matching resistor connected between the pad portion and the fifth test data line.

16. The display device of claim 14, wherein:
the second data line is connected with a first pixel among the pixels, the first pixel being configured to display a first color; and
the fifth data line is connected with a second pixel among the pixels, the second pixel being configured to display a second color.

17. The display device of claim 14, wherein the second crack detection circuit is disposed between the bending area and the pad portion.

18. The display device of claim 17, wherein:
the second crack detection line comprises a portion passing through the bending area; and
in the bending area, the first crack detection line is disposed between the second crack detection line and an outer edge of the peripheral area.

19. The display device of claim 14, wherein the bending area is disposed between the first crack detection circuit and the second crack detection circuit.

20. The display device of claim 1, further comprising:
a strain gauge comprising a resistor line, the resistor line being disposed in the bending area.

21. The display device of claim 20, wherein the resistor line is disposed between the first crack detection line and an outer edge of the peripheral area.

22. A display device comprising:
a substrate comprising:
a display area comprising pixels and data lines; and
a peripheral area disposed outside the display area;
a bending area disposed in the peripheral area, the bending area being bendable or in a bent state;
a first crack detection line disposed in the bending area and adjacent to a first edge of the substrate extending in a first direction, the first crack detection line being associated with first pixels among the pixels, the first pixels being configured to emit light of a first color, the first crack detection line being configured to detect a crack generated in the bending area; and
a second crack detection line disposed in the peripheral area outside the bending area and adjacent to the first edge of the substrate, the second crack detection line being associated with second pixels among the pixels, the second pixels being configured to emit light of a second color different from the first pixels, the second crack detection line being configured to detect a crack generated in the peripheral area outside the bending area,
wherein:
the first crack detection line is not connected to the second crack detection line; and
the first crack detection line is spaced apart from the second crack detection line in the first direction.

23. The display device of claim 22, further comprising:
a first crack detection circuit comprising a first switch and a second switch; and
a second crack detection circuit comprising a third switch and a fourth switch,
wherein:

the first switch is connected with a first end of the first crack detection line;
the second switch is connected with a second end of the first crack detection line;
the third switch is connected with a first end of the second crack detection line; and
the fourth switch is connected with a second end of the second crack detection line.

24. The display device of claim 23, wherein the first switch, the second switch, the third switch, and the fourth switch are respectively connected with the data lines.

25. The display device of claim 24, wherein:
the first switch and the second switch are connected with a first color pixel among the pixels, the first color pixel being configured to display a first color; and
the third switch and the fourth switch are connected with a second color pixel among the pixels, the second color pixel being configured to display a second color that is different from the first color.

* * * * *